US010555437B2

(12) United States Patent
Little

(10) Patent No.: US 10,555,437 B2
(45) Date of Patent: Feb. 4, 2020

(54) ELECTRICAL CONNECTOR ASSEMBLY EQUIPPED WITH HEAT PIPE AND ADDITIONAL HEAT SINK

(71) Applicant: FOXCONN INTERCONNECT TECHNOLOGY LIMITED, Grand Cayman (KY)

(72) Inventor: Terrance F. Little, Fullerton, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/013,881

(22) Filed: Jun. 20, 2018

(65) Prior Publication Data

US 2018/0368283 A1 Dec. 20, 2018

Related U.S. Application Data

(60) Provisional application No. 62/522,113, filed on Jun. 20, 2017.

(51) Int. Cl.
*H05K 7/20* (2006.01)
*H01R 12/72* (2011.01)
*H01R 13/6581* (2011.01)
*H01R 13/518* (2006.01)

(52) U.S. Cl.
CPC ....... *H05K 7/20336* (2013.01); *H01R 12/722* (2013.01); *H01R 13/518* (2013.01); *H01R 13/6581* (2013.01); *H05K 7/20418* (2013.01); *H05K 7/20445* (2013.01)

(58) Field of Classification Search
None
See application file for complete search history.

(56) References Cited

U.S. PATENT DOCUMENTS

| 6,075,698 | A * | 6/2000 | Hogan | H05K 7/20581 165/104.34 |
|---|---|---|---|---|
| 6,175,503 | B1 * | 1/2001 | Hogan | H02M 7/003 312/349 |
| 9,389,368 | B1 | 7/2016 | Tyco | |
| 9,391,407 | B1 | 7/2016 | Tyco | |
| 9,484,678 | B1 | 11/2016 | Tyco | |
| 9,509,102 | B2 | 11/2016 | Tyco | |
| 9,620,907 | B1 | 4/2017 | Tyco | |
| 9,668,379 | B1 | 5/2017 | Tyco | |
| 2014/0302713 | A1 * | 10/2014 | Su | H01R 12/7082 439/607.35 |

(Continued)

*Primary Examiner* — Truc T Nguyen
(74) *Attorney, Agent, or Firm* — Wei Te Chung; Ming Chieh Chang

(57) ABSTRACT

An electrical receptacle assembly includes a metallic cage defining a receiving space therein, a receptacle connector unit is received in the receiving space. The receptacle connector unit includes a pair of mating ports. An middle heat transfer unit is located between the two mating ports in a vertical direction. The middle heat transfer unit includes a plastic thermal pad with a pair of heat pipes insert-molded on two sides. The pair of heat pipes extend through a rear wall of the cage and connect to a rear heat sink unit located behind the rear wall of the cage. An electrical plug module assembly equipped with a metallic case composed of the upper part and the lower part each having a heat sink structure unitarily formed on the exterior surfaces.

5 Claims, 37 Drawing Sheets

(56) References Cited

U.S. PATENT DOCUMENTS

| | | | |
|---|---|---|---|
| 2016/0064873 A1* | 3/2016 | Bucher | H01R 12/7076 |
| | | | 385/88 |
| 2016/0197424 A1* | 7/2016 | L'Esperance | H01R 12/721 |
| | | | 439/61 |
| 2016/0211623 A1 | 7/2016 | Tyco | |
| 2016/0295744 A1* | 10/2016 | Regnier | G02B 6/4269 |
| 2017/0054234 A1* | 2/2017 | Kachlic | H01R 12/712 |
| 2017/0077643 A1 | 3/2017 | Samtec | |
| 2019/0181593 A1* | 6/2019 | Little | H01R 13/6587 |

* cited by examiner

US 10,555,437 B2

ELECTRICAL CONNECTOR ASSEMBLY EQUIPPED WITH HEAT PIPE AND ADDITIONAL HEAT SINK

BACKGROUND OF THE INVENTION

1. Field of the Invention

The present invention relates to an electrical connector assembly, especially to the terminal layout and the terminal module assembly thereof and the so-called FP5 connector following the previous designs of which the provisional application Ser. Nos. 62/367,098 filed on Jul. 26, 2016, 62/399,272 filed on Sep. 23, 2016, 62/412,841 filed on Oct. 26, 2016, 62/425,627 filed on Nov. 23, 2016, 62/449,133 filed on Jan. 23, 2017, and 62/509,141 filed on May 21, 2017.

2. Description of Related Art

Currently QSFP-DD Specification Rev. 0.1 discloses a 1×1 QSFP-DD module has eight electrical lanes. Each of the eight electrical lanes of the QSFP runs at the rate of 25 Gbit/s or 50 Gbit/s, thereby the QSFP-DD module support 200 Gbit/s or 400 Gbit/s Ethernet applications of. The QSFP-DD module has an electrical receptacle. The electrical receptacle has an insulative housing and four rows of electrical terminals received in the insulative housing. Each of the electrical terminals has a soldering section. Two rows soldering sections of the two top rows of the electrical terminals are offset in a longitudinal direction from two rows soldering sections of the two bottom rows of the electrical terminals. It is noted that another design having the fine pitch of 0.5 mm having the similar interface with QSFP is also presented.

Even though both aforementioned connector assemblies are equipped with the heat sink for removing heat, anyhow a better heat transfer with the additional heat sink thereof is desired.

SUMMARY OF THE INVENTION

An object of the present invention is to provide an electrical connector assembly equipped with the heat pipe and the additional heat sink to promote superior heat transfer performance of the whole electrical connector assembly.

To achieve the above-mentioned object, an electrical receptacle assembly includes a metallic cage defining a receiving space therein, a receptacle connector unit is received in the receiving space. The receptacle connector unit includes a pair of mating ports and a plurality of terminal wafers stacked with one another with corresponding contacting sections exposed upon the mating ports and tail sections extending downwardly to be soldered upon a printed circuit board on which the receptacle connector unit is mounted. An middle heat transfer unit is located between the two mating ports in a vertical direction. The middle heat transfer unit includes a heat base linked with a pair of heat pipes on two sides. The pair of heat pipes extend through a rear wall of the cage and connect to a rear heat sink unit located behind the rear wall of the cage. A top heat sink unit is located upon the cage, which is to remove the heat of the plug module inserted into the cage via an opening formed in a top face of the cage. The middle heat transfer unit includes a thermal plastic pad equipped with a pair of heat pipes insert-molded therein wherein each heat pipe includes one oblique section embedded within the thermal plastic pad.

Another approach is to have the plug module, which is adapted to be received within a similar cage for mating with a similar receptacle connector, equipped with the heat sink structure on both the top surface and the bottom surface of the case for better heat transfer thereabouts.

Other objects, advantages and novel features of the invention will become more apparent from the following detailed description when taken in conjunction with the accompanying drawings.

DETAILED DESCRIPTION OF THE PREFERRED EMBODIMENT

Figure 1A:
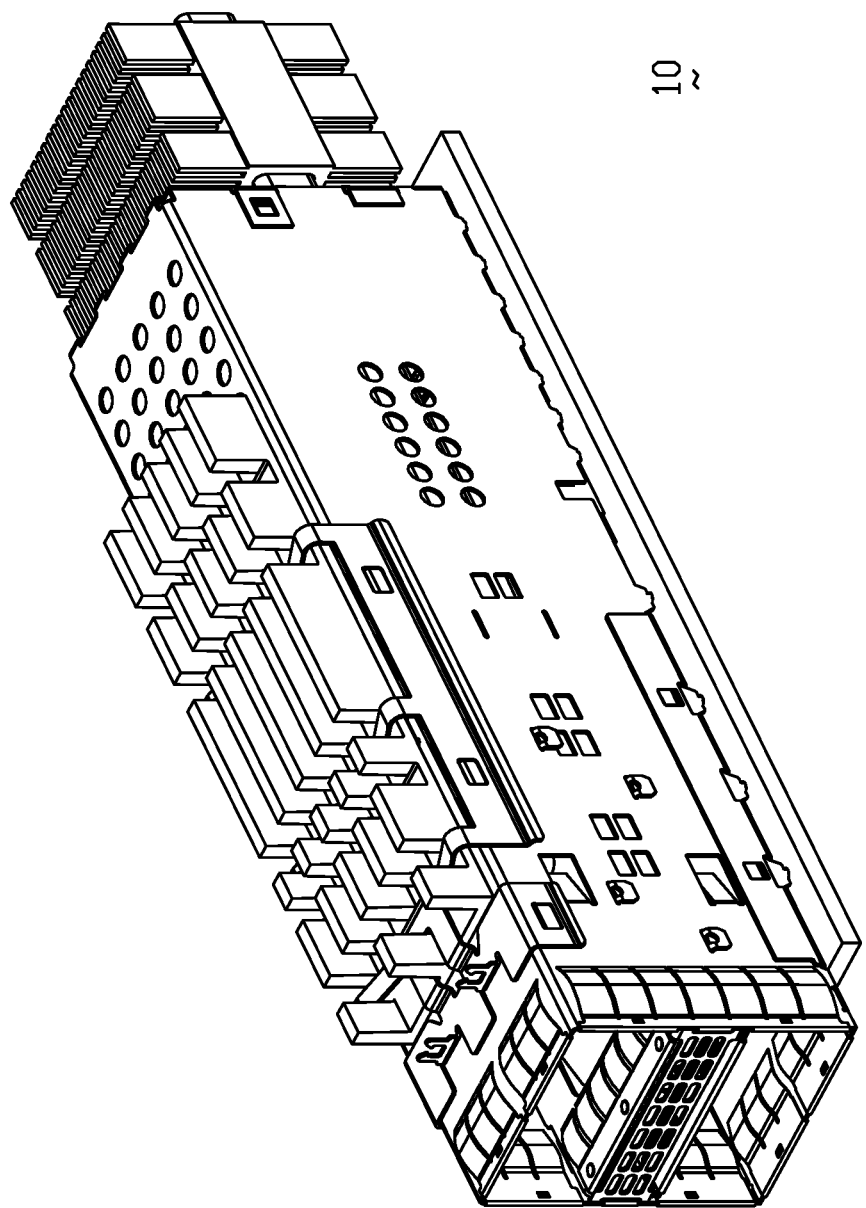
FIG. 1(A) is a perspective view of an electrical connector assembly according to a first embodiment of the present invention including a receptacle connector mounted upon a printed circuit board and enclosed within a cage.
Figure 1B:
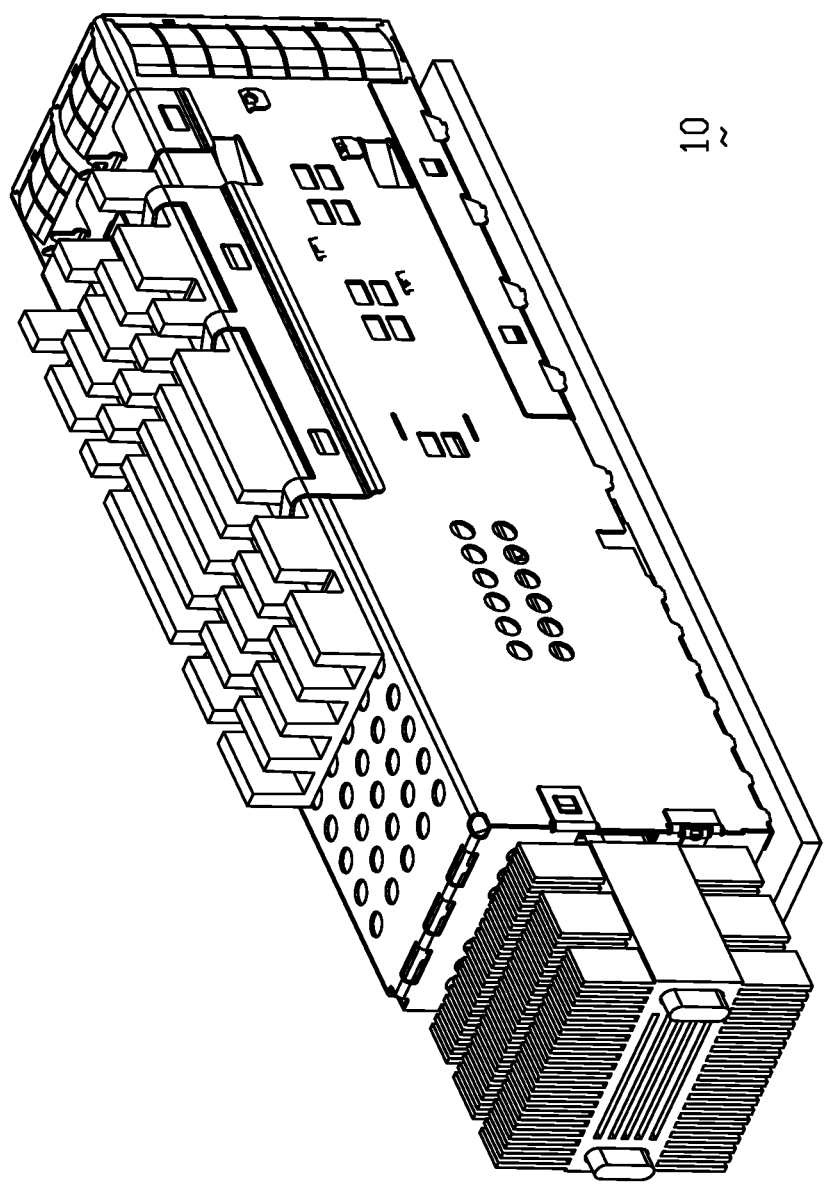
FIG. 1(B) is another perspective view of the electrical connector assembly of FIG. 1.
Figure 2A:
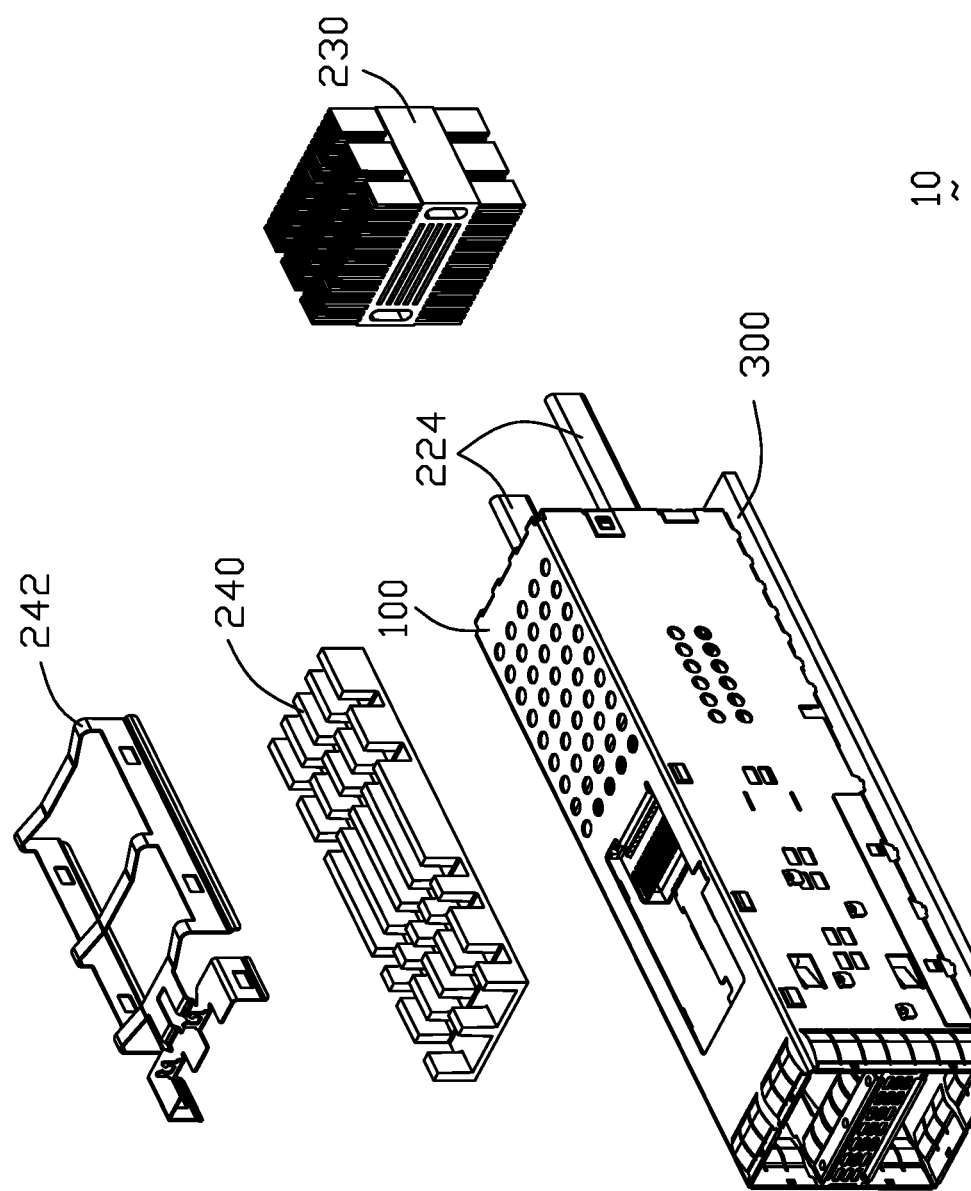
FIG. 2(A) is an exploded perspective view of the electrical connector assembly of FIG. 1 wherein the heat sinks are removed therefrom.
Figure 2B:
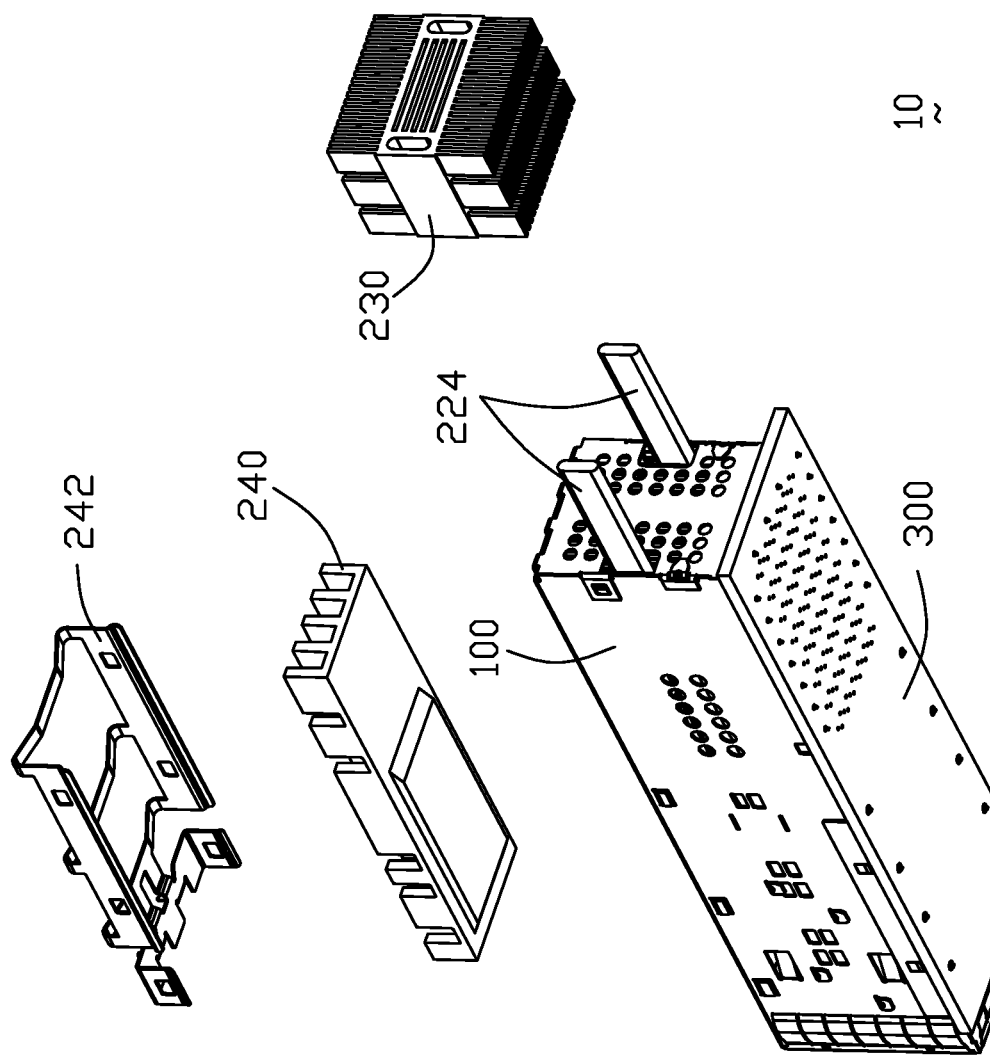
FIG. 2(B) is another exploded perspective view of the electrical connector assembly of FIG. 1.
Figure 3A:
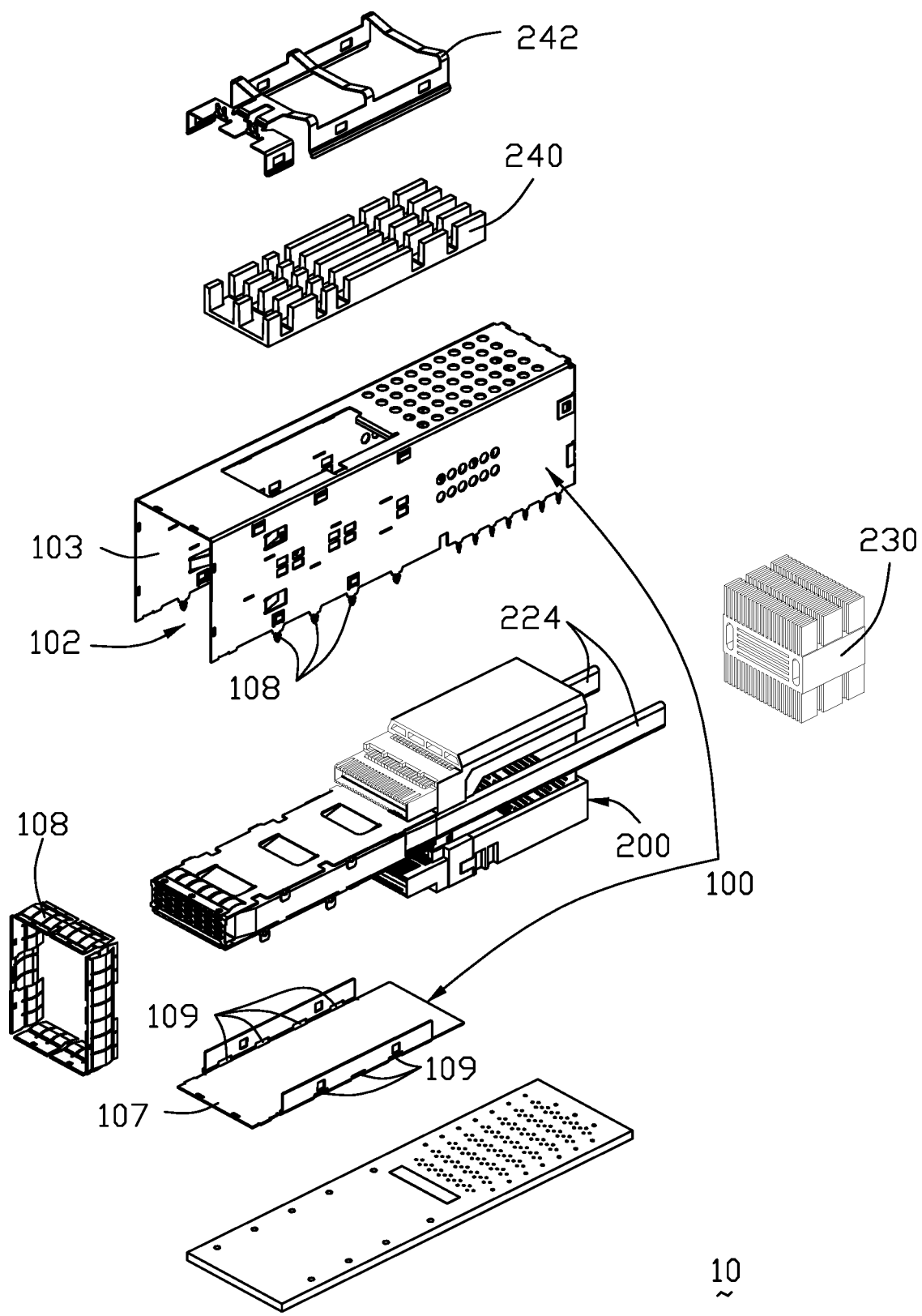
FIG. 3(A) is a further exploded perspective view of an electrical connector assembly of FIG. 2(A)
Figure 3B:
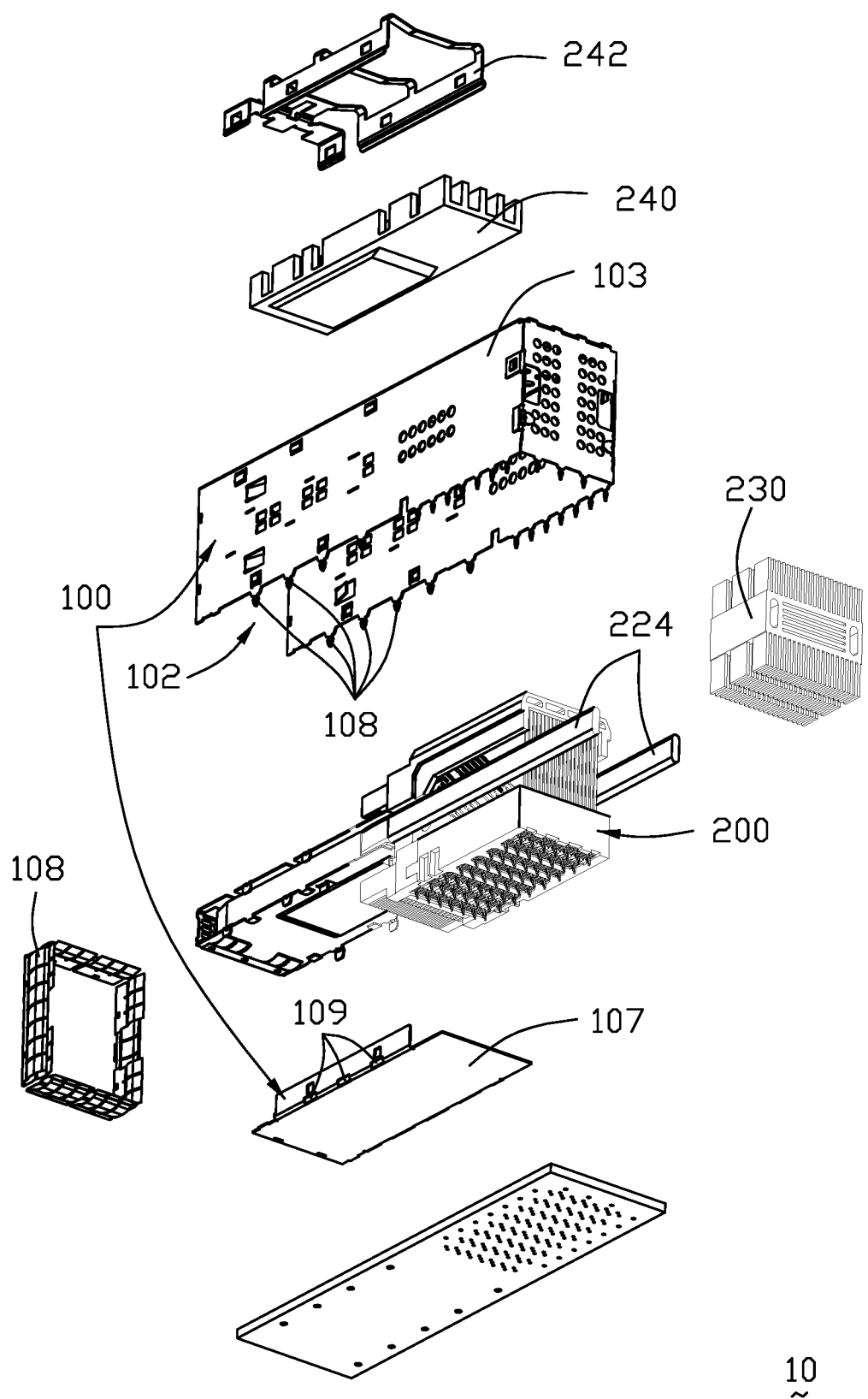
FIG. 3(B) is another further exploded perspective view of the electrical connector assembly of FIG. 2(B)
Figure 4A:
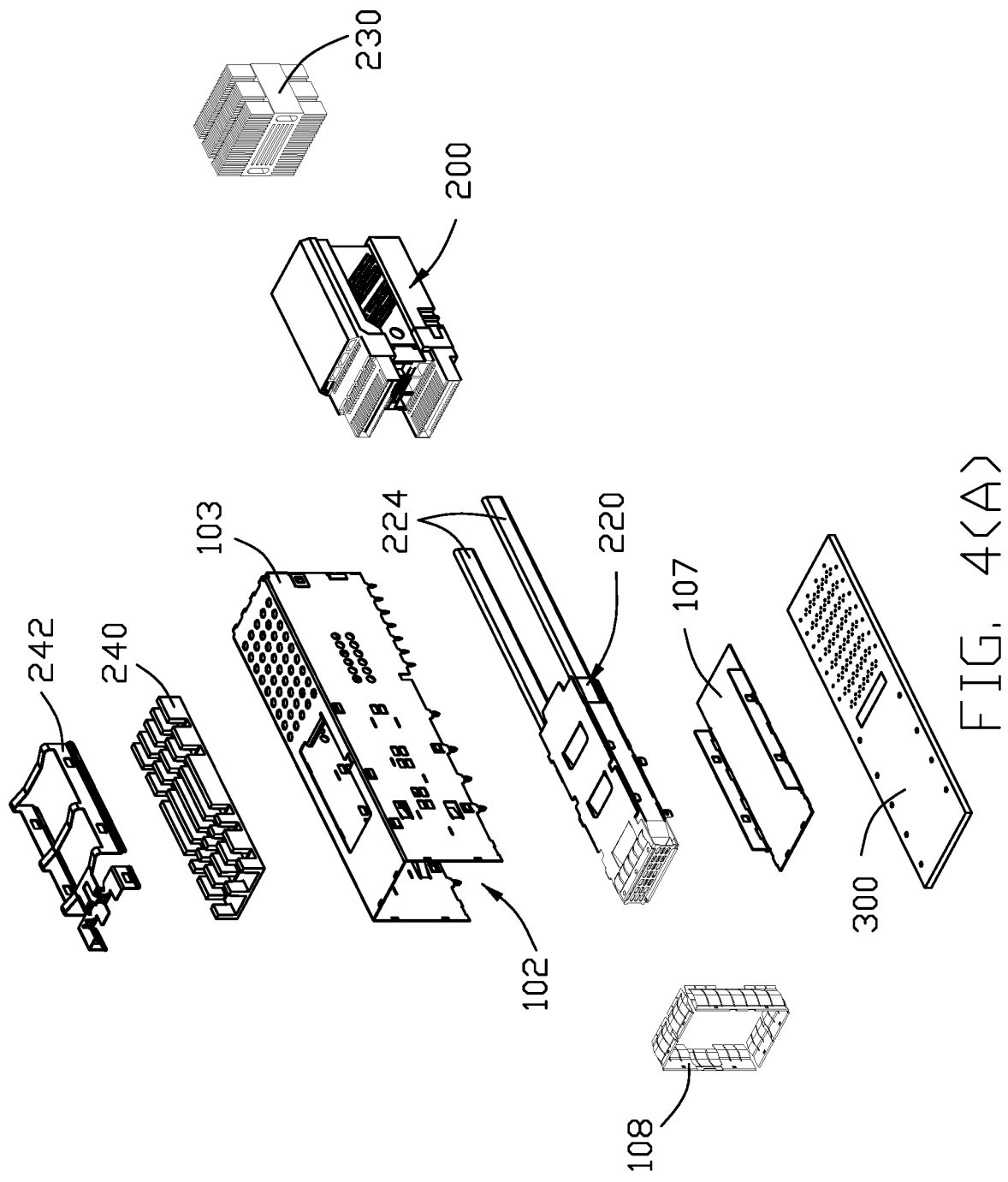
FIG. 4(A) is a further exploded perspective view of the electrical connector assembly of FIG. 3(A)
Figure 4B:
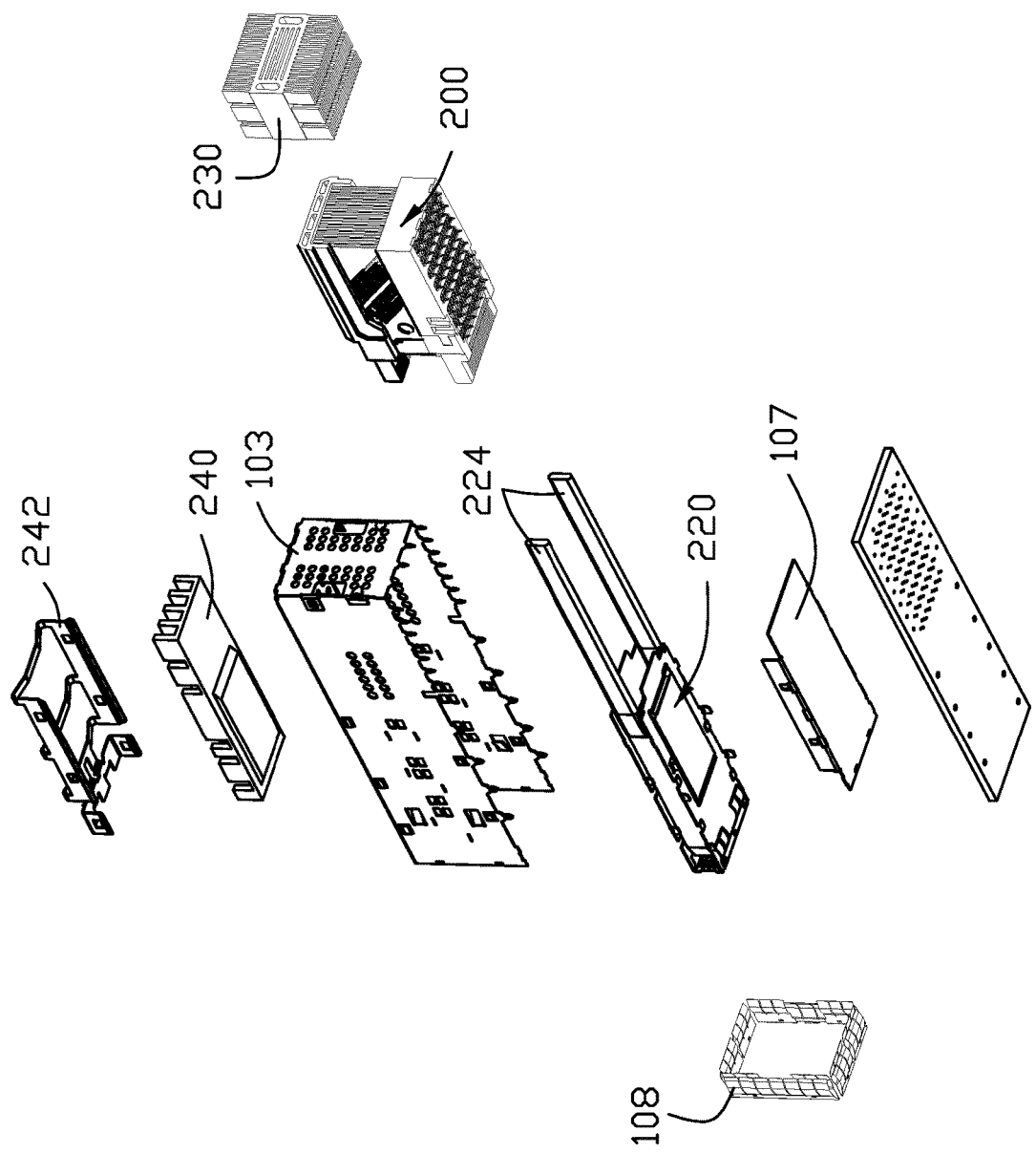
FIG. 4(B) is another further exploded perspective view of the electrical connector assembly of FIG. 3(B)
Figure 5A:
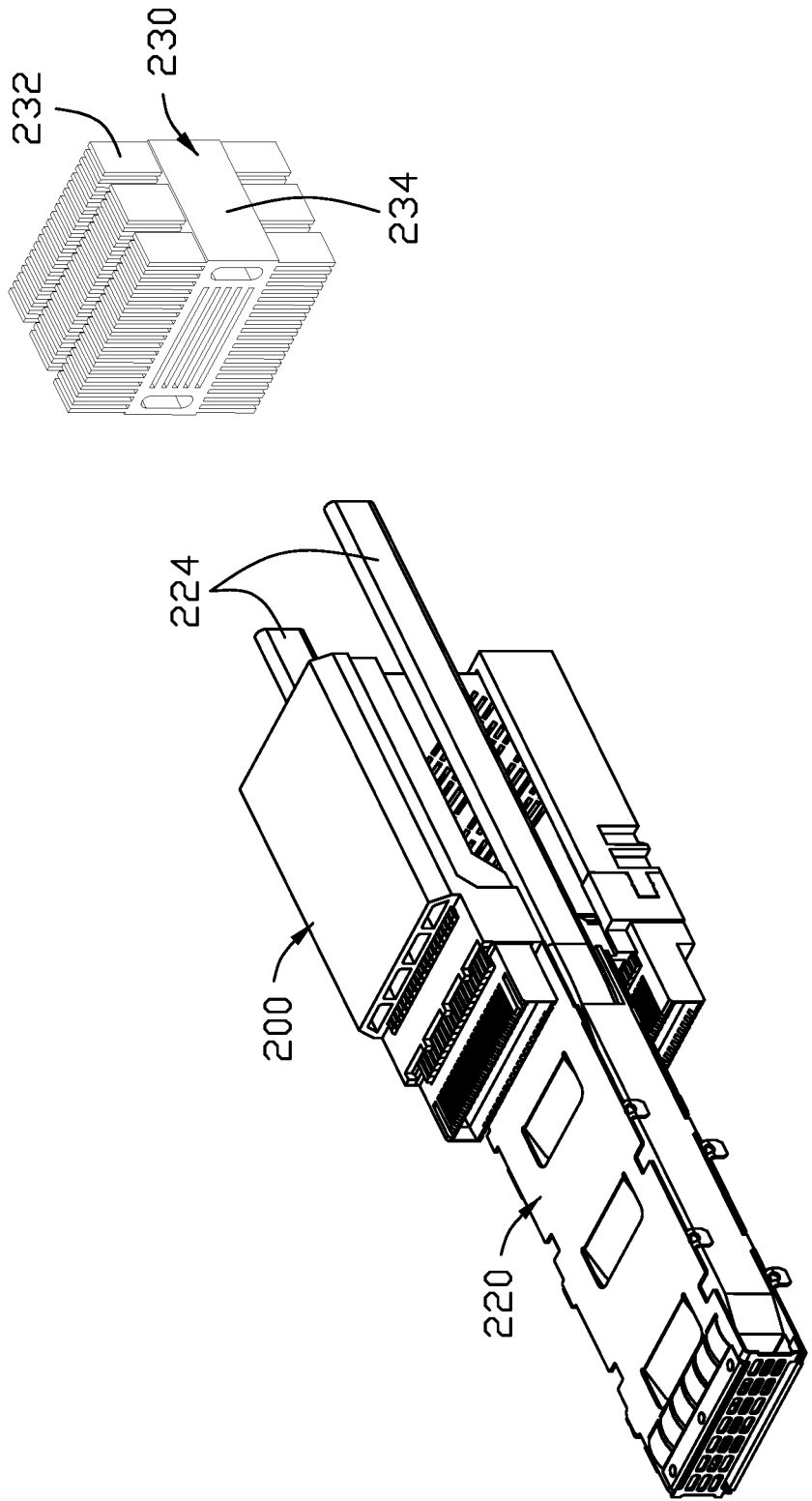
FIG. 5(A) is an exploded perspective view of the receptacle connector unit and the middle heat transfer unit of the electrical connector assembly of FIG. 1(A)
Figure 5B:
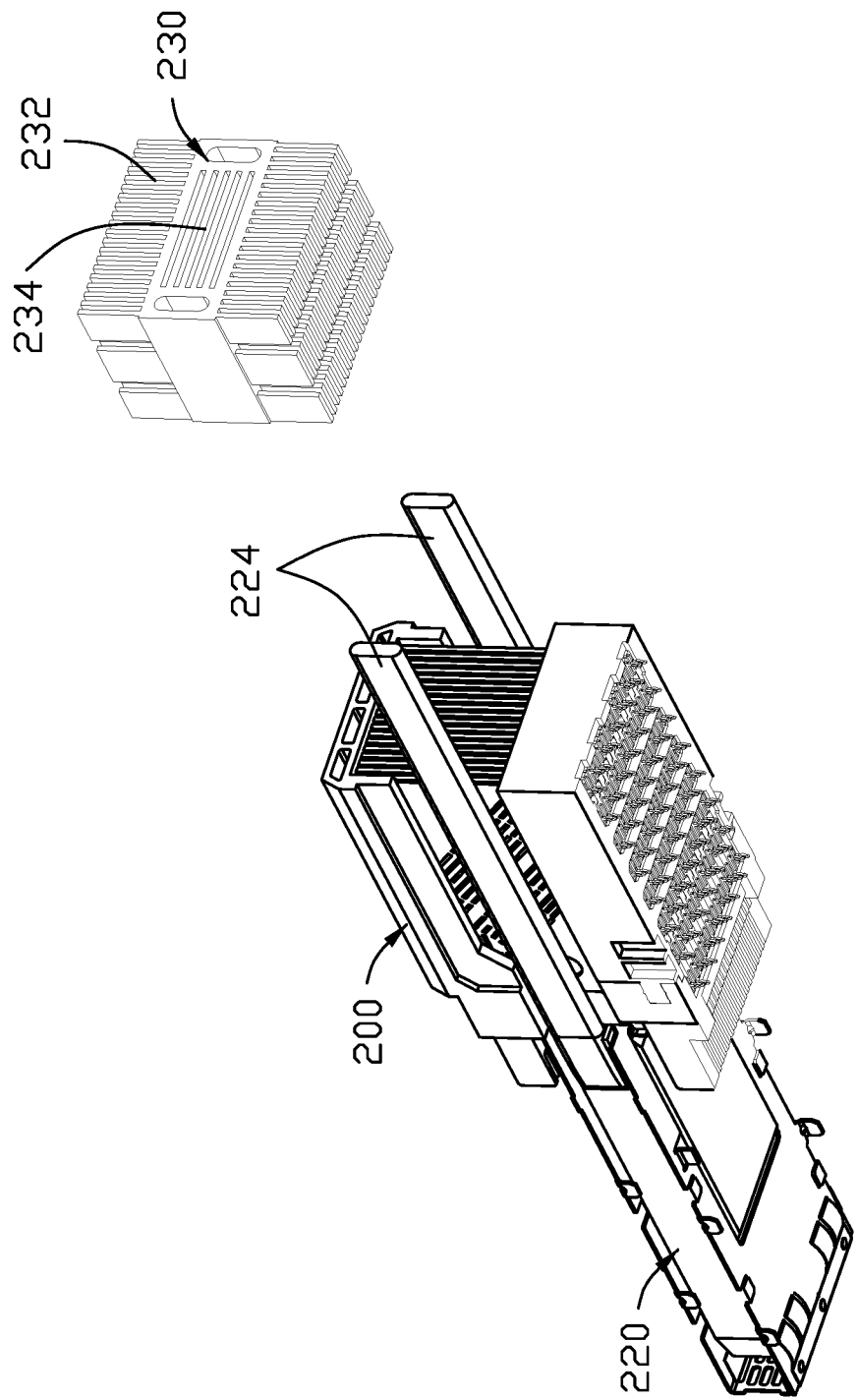
FIG. 5(B) is another exploded perspective view of the receptacle connector unit and the middle heat transfer unit of the electrical connector of FIG. 1(B)
Figure 6:
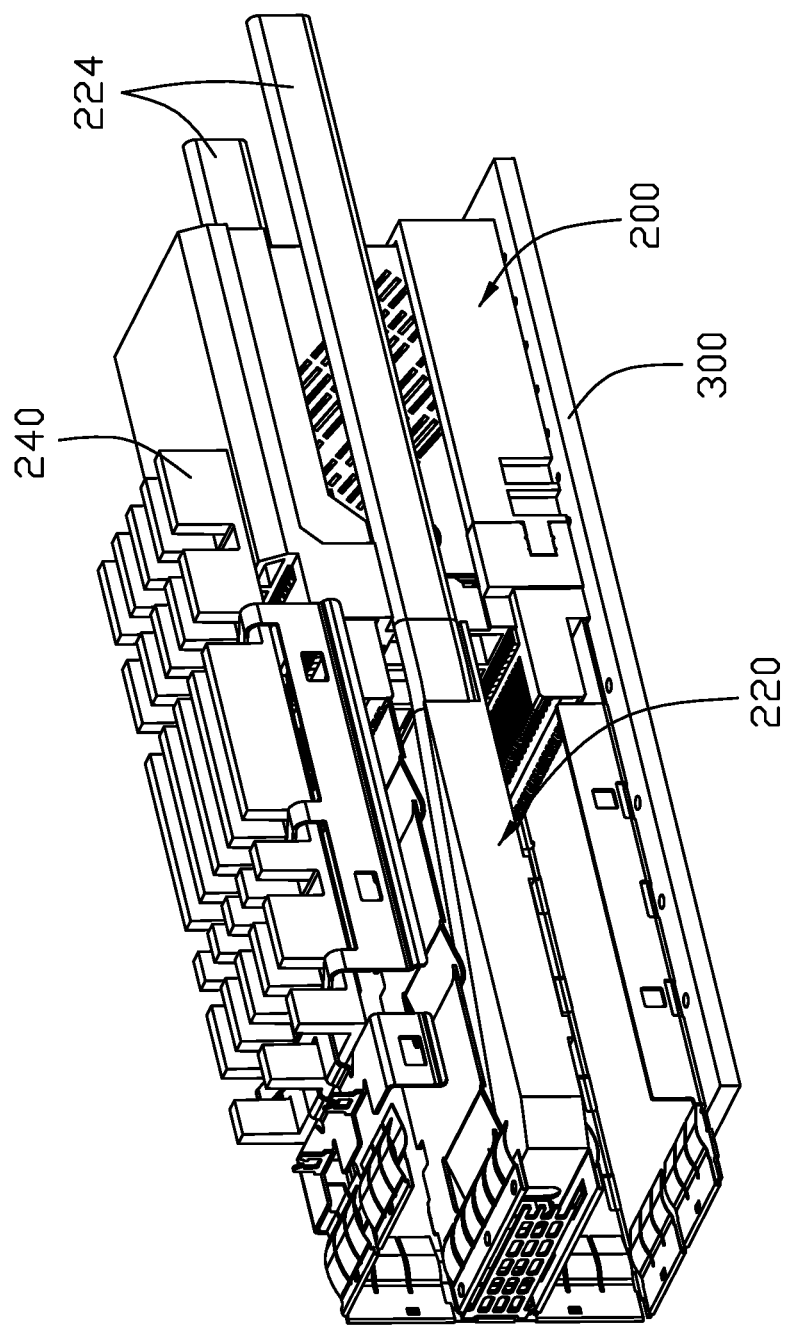
FIG. 6 is a cut-away perspective view of the receptacle connector unit and the middle heat transfer unit mounted upon the printed circuit board of the electrical connector assembly of FIG. 1(A)
Figure 7:
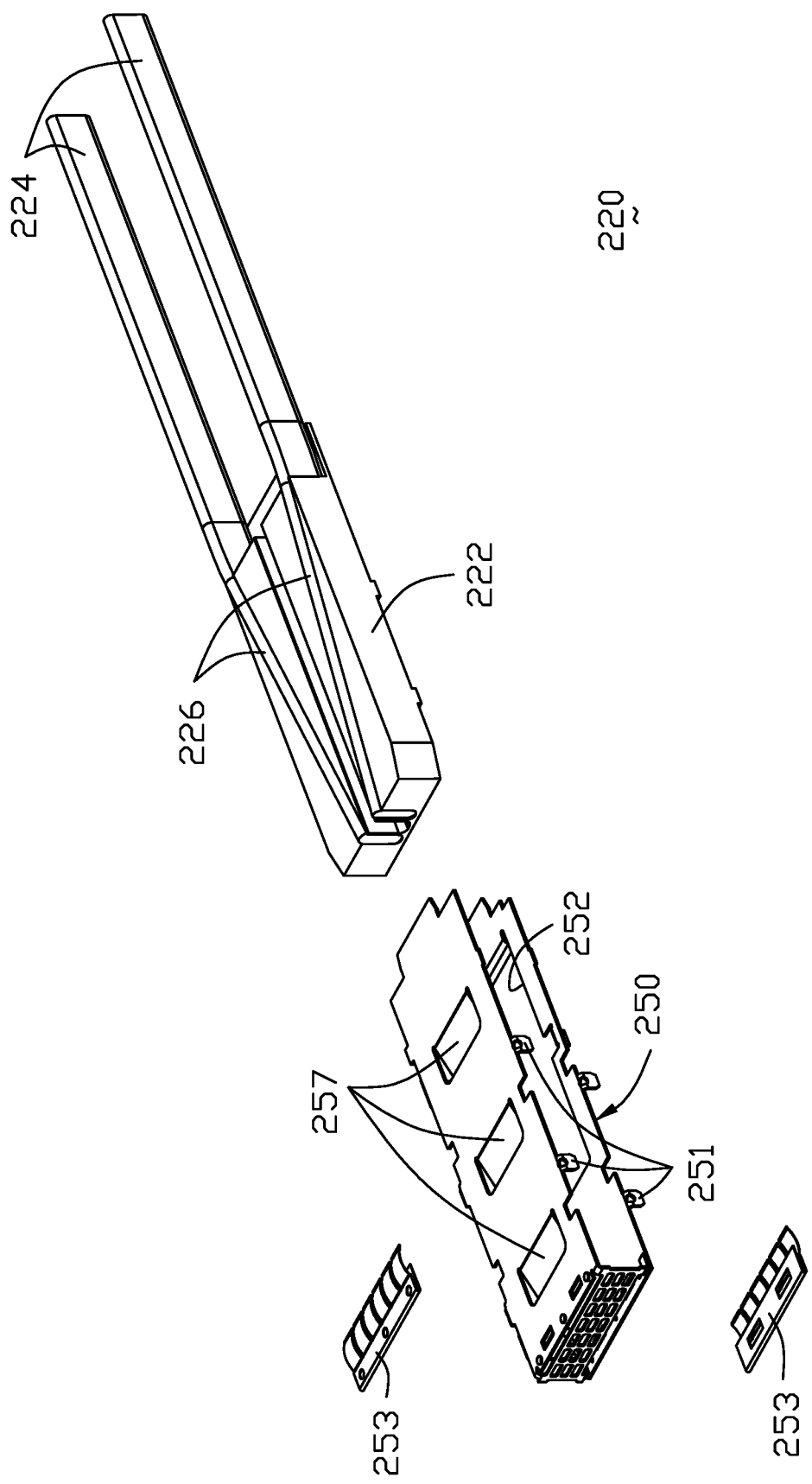
FIG. 7 is an exploded perspective exploded view of the middle heat transfer unit of the electrical connector assembly of FIG. 1(A)
Figure 8:
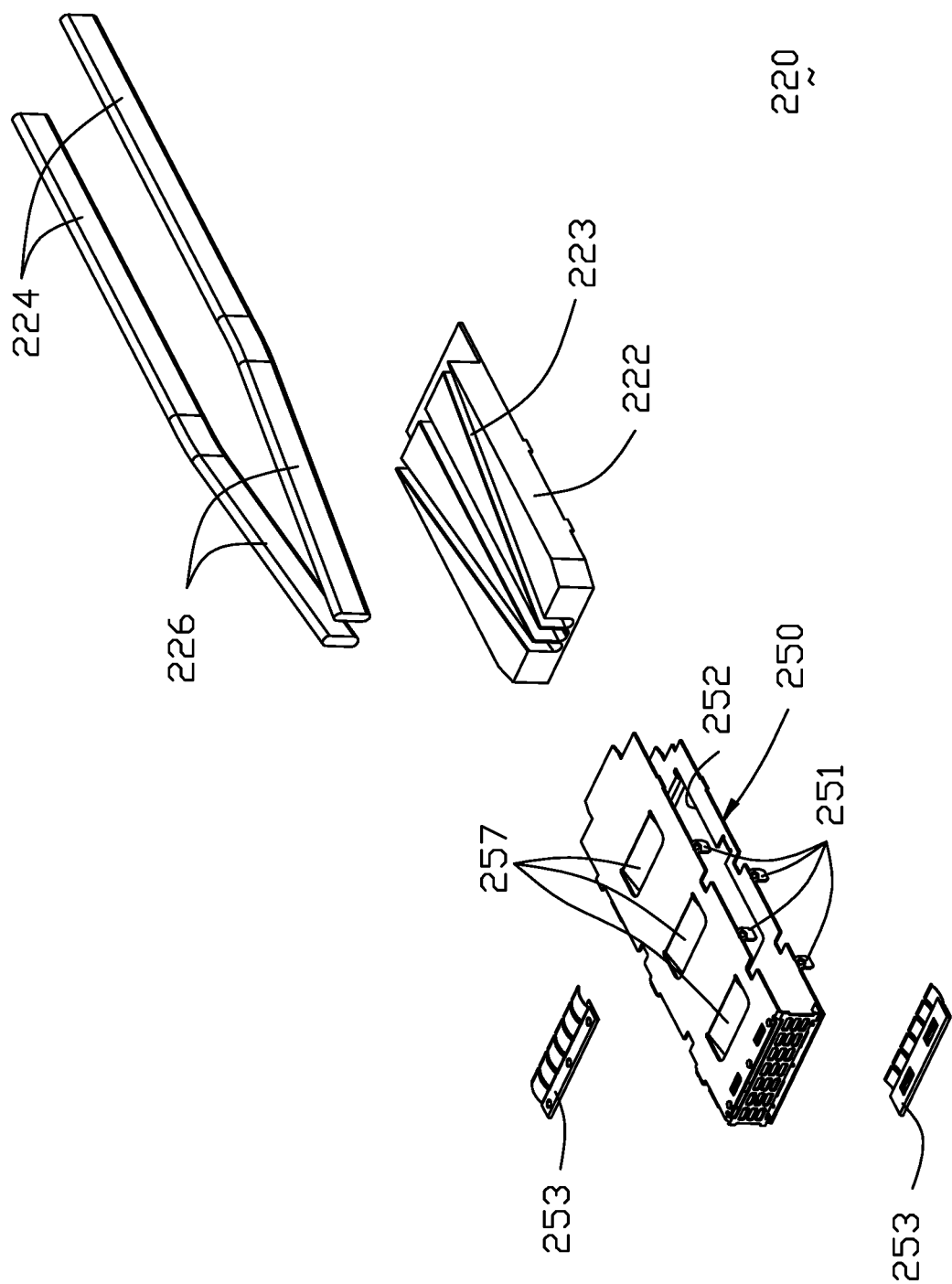
FIG. 8 is a further exploded perspective view of middle heat transfer unit of the electrical connector assembly of FIG. 7.
Figure 9:
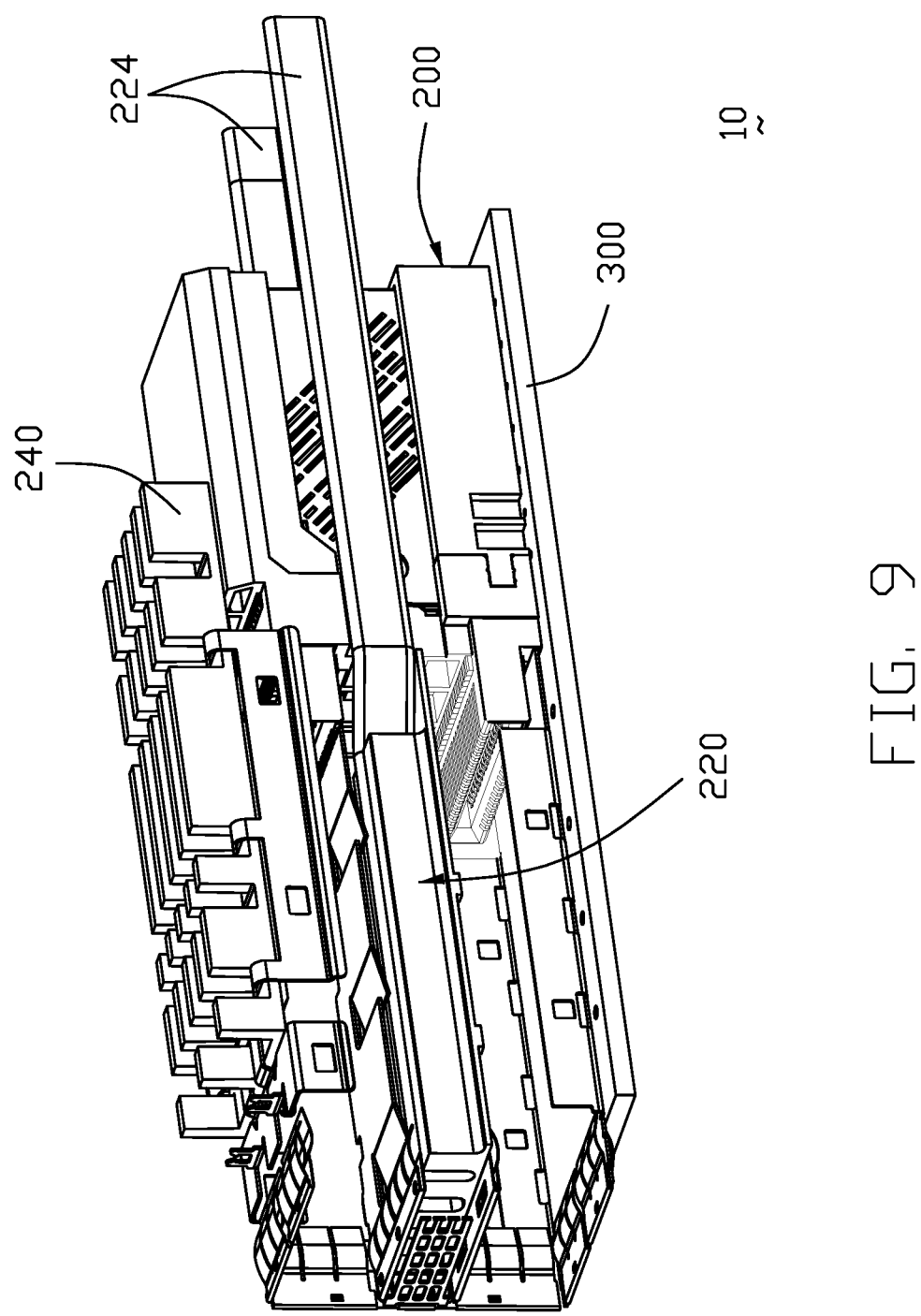
FIG. 9 is a cut-away perspective view of the receptacle unit and the middle heat transfer unit of the electrical connector assembly according to a second embodiment of the invention.
Figure 10:
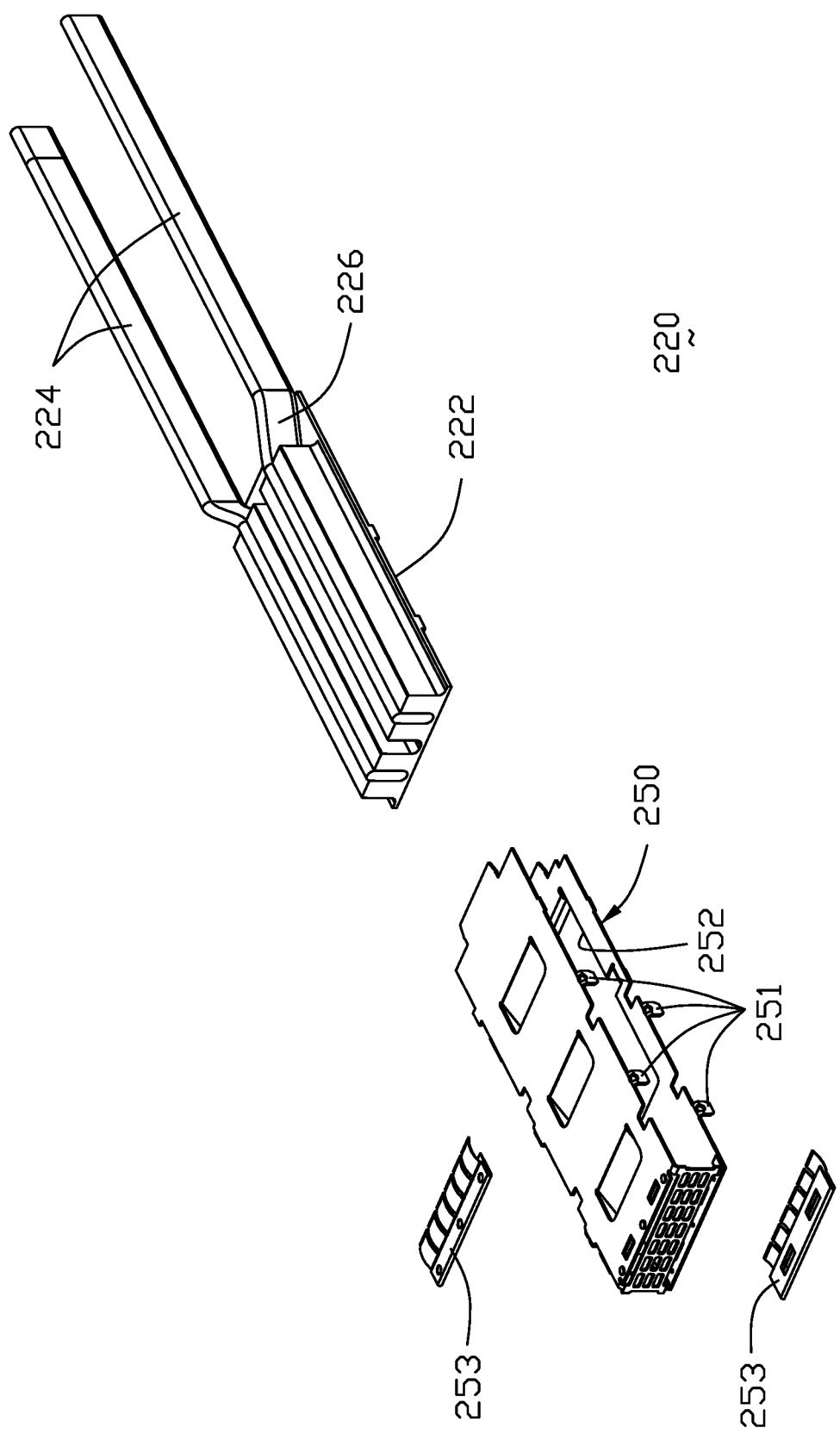
FIG. 10 is an exploded perspective view of the middle heat transfer unit of the electrical connector assembly of FIG. 9.
Figure 11:
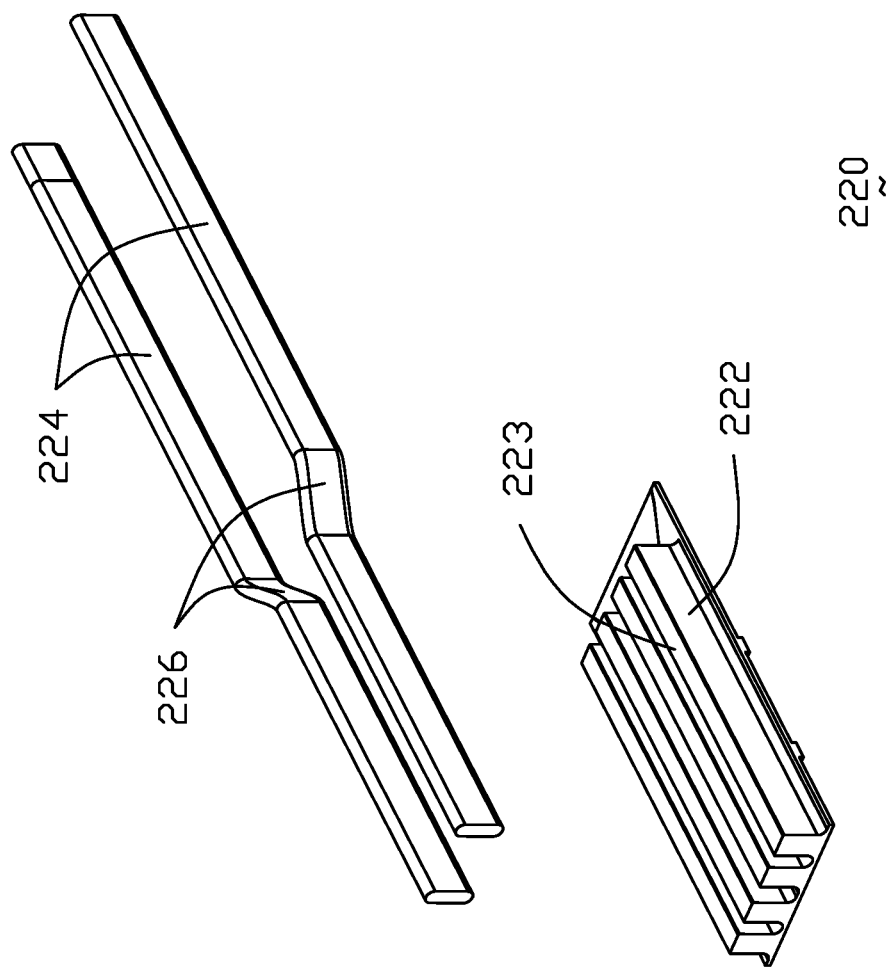
FIG. 11 is a further exploded perspective view of the middle heat transfer unit of the electrical connector assembly of FIG. 10.
Figure 11:
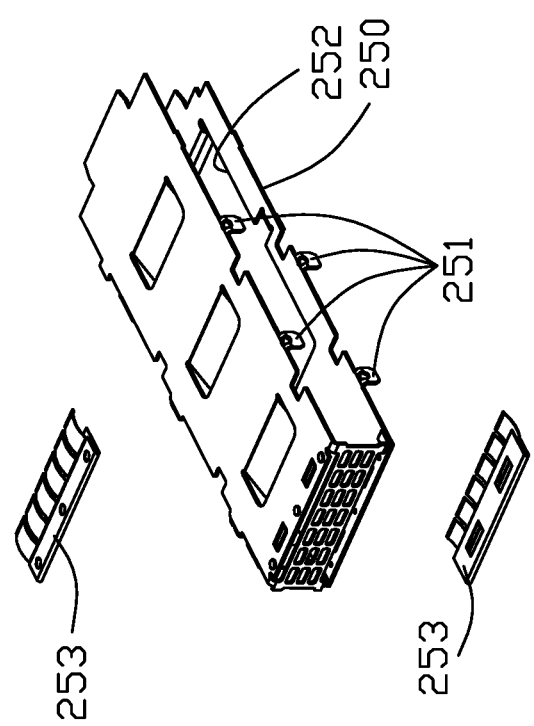
Figure 12A:
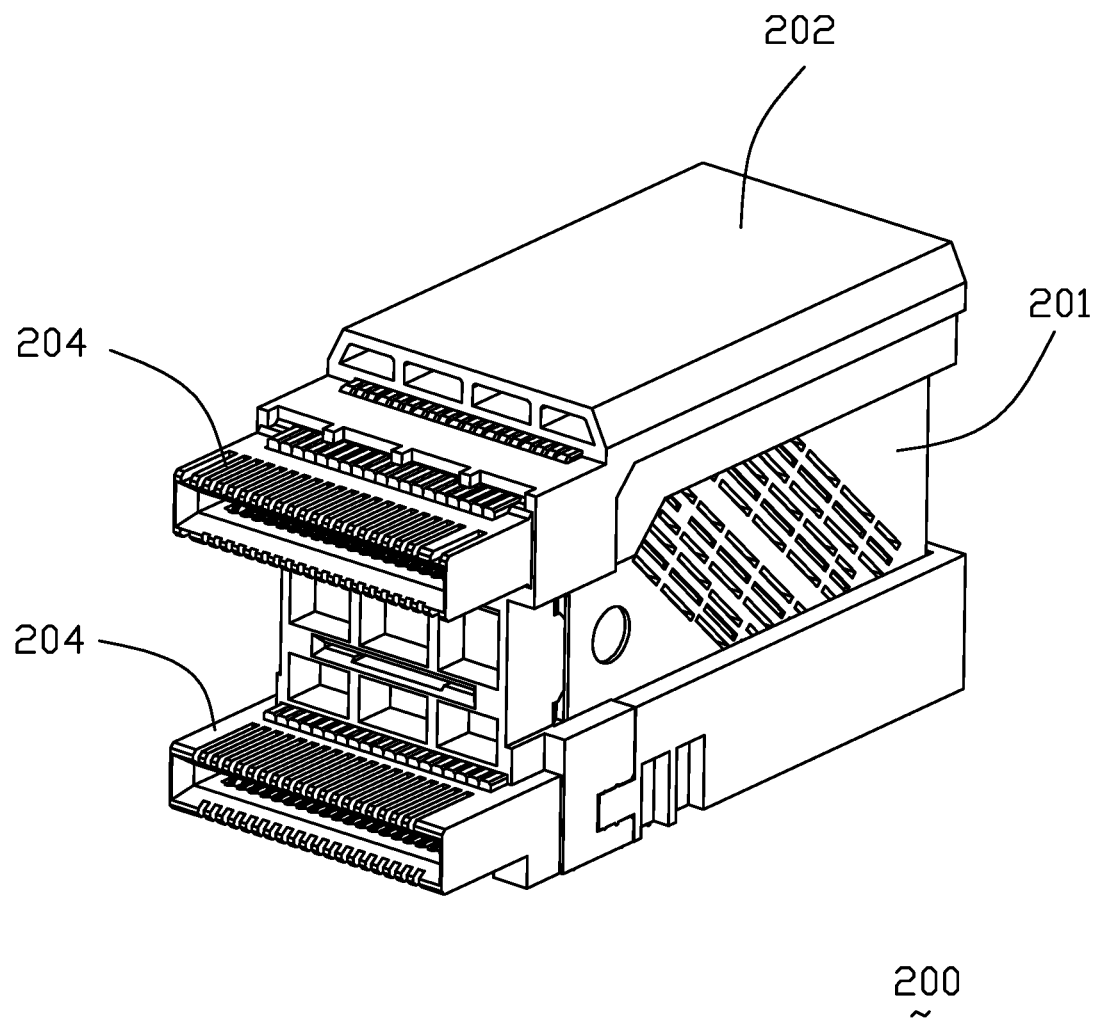
FIG. 12(A) is a perspective view of the electrical receptacle unit of the electrical connector assembly of FIGS. 1 and 9.
Figure 12B:
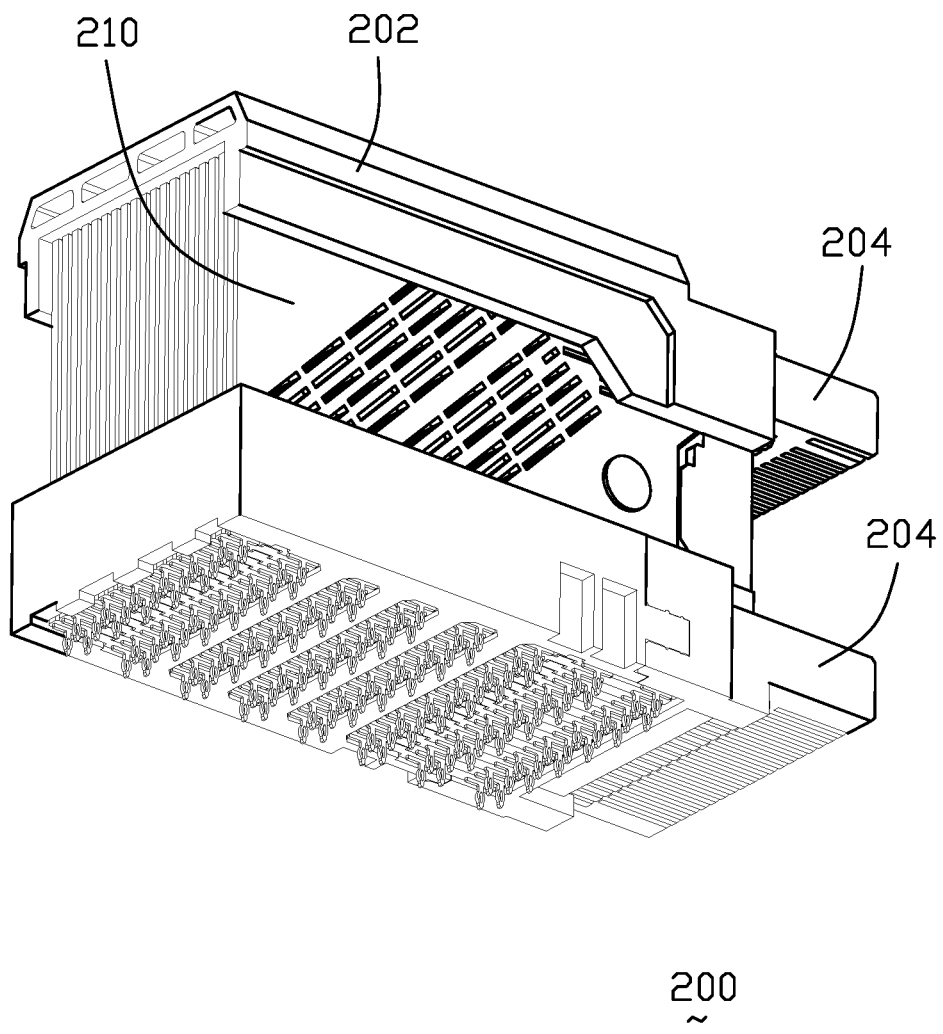
FIG. 12(B) is another perspective view or the receptacle connector unit of FIG. 12(B)
Figure 13A:
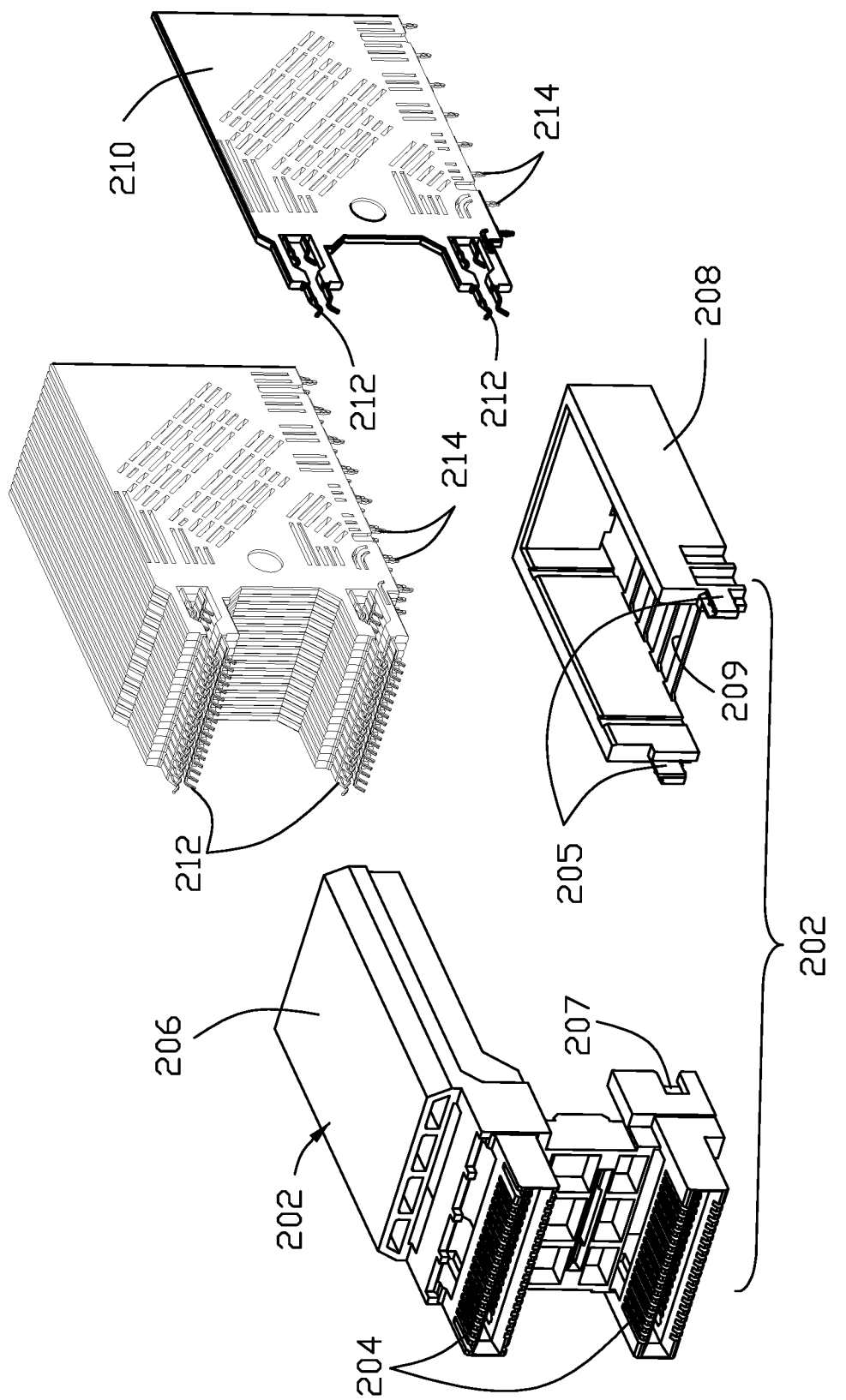
FIG. 13(A) is an exploded perspective view of the receptacle connector unit of FIG. 12(A)
Figure 13B:
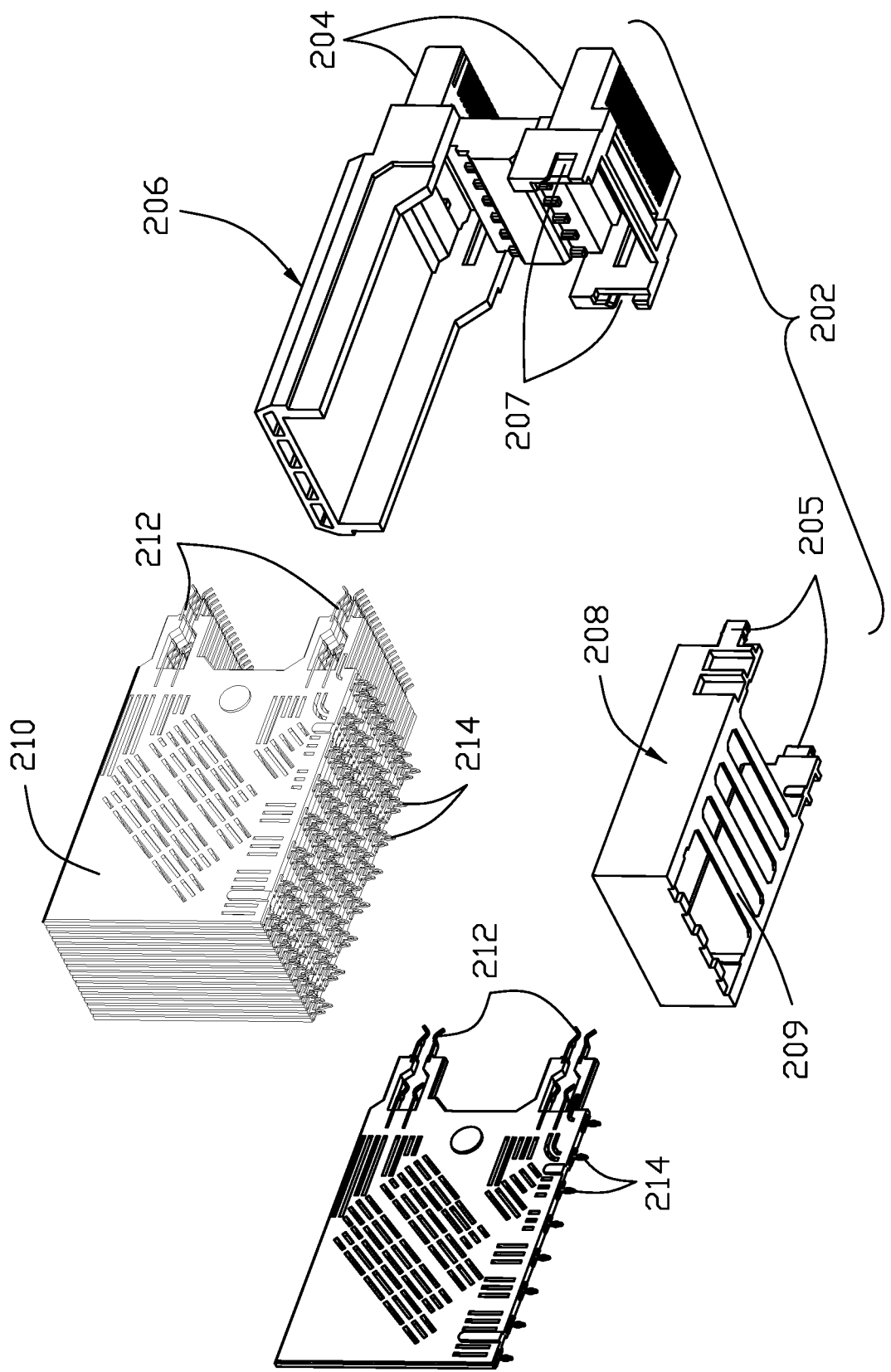
FIG. 13(B) is another exploded perspective view of the receptacle connector of FIG. 12(B)
Figure 14A:
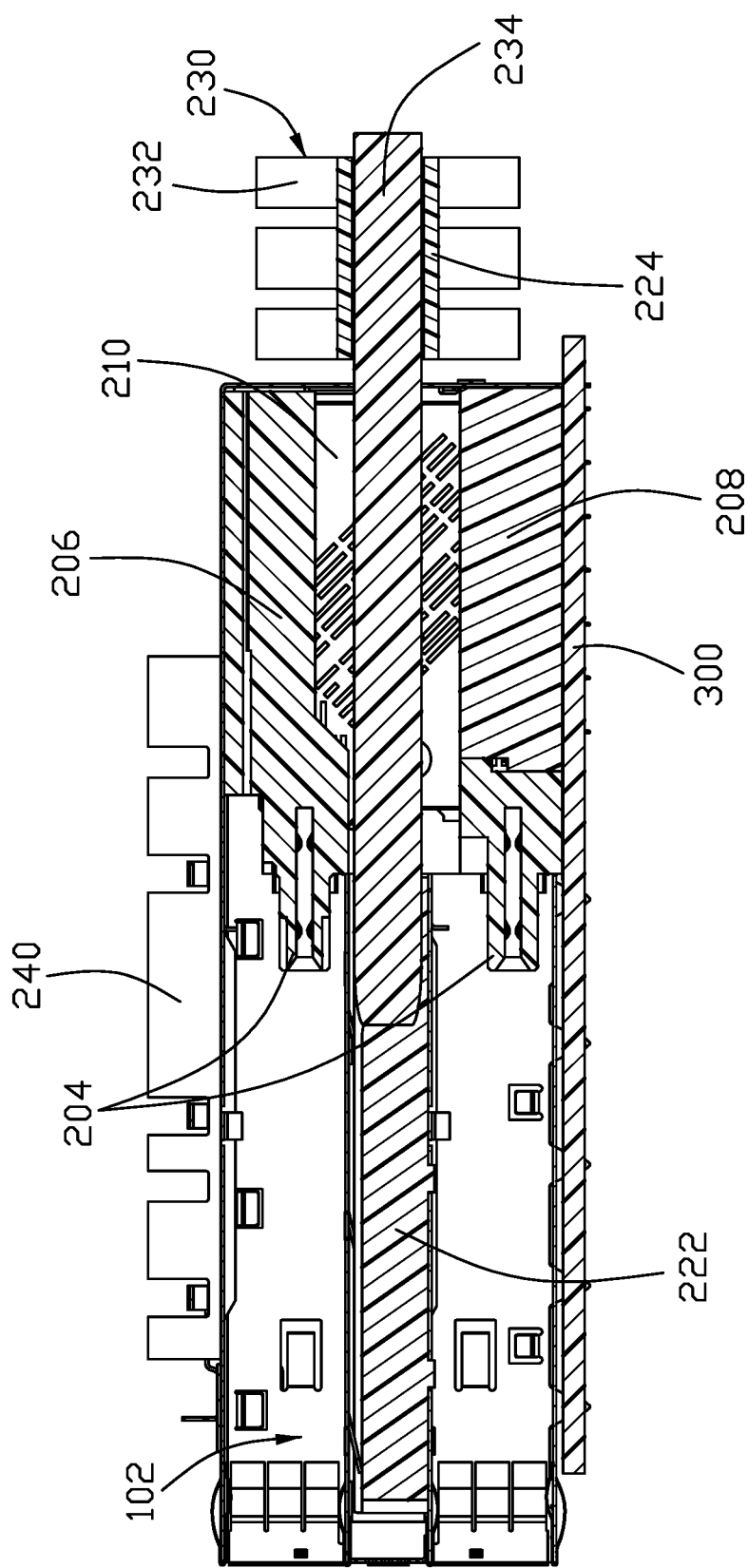
FIG. 14(A) is a cross-sectional view of the electrical connector assembly of FIG. 1.
Figure 14B:
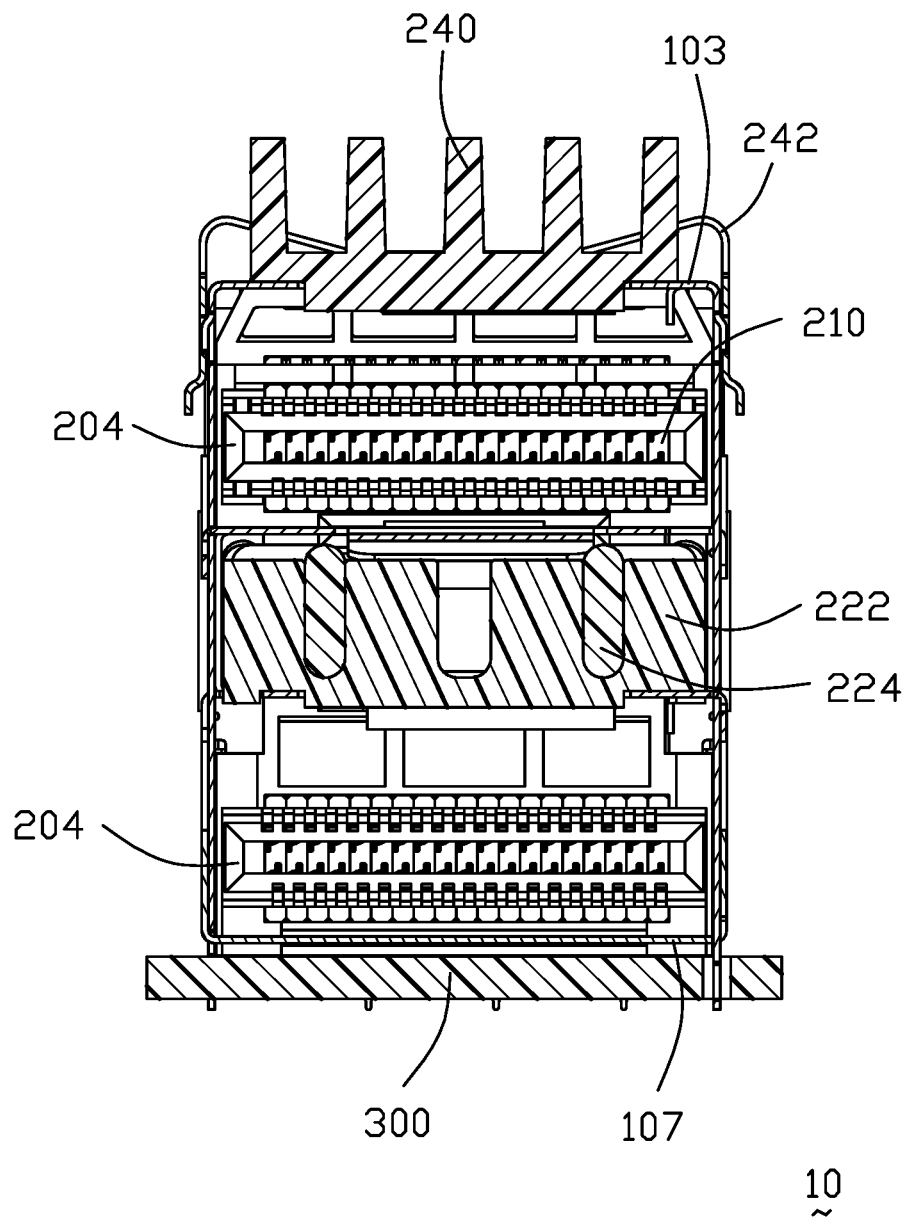
FIG. 14(B) is another cross-sectional view or the electrical connector assembly of FIG. 1.
Figure 15:
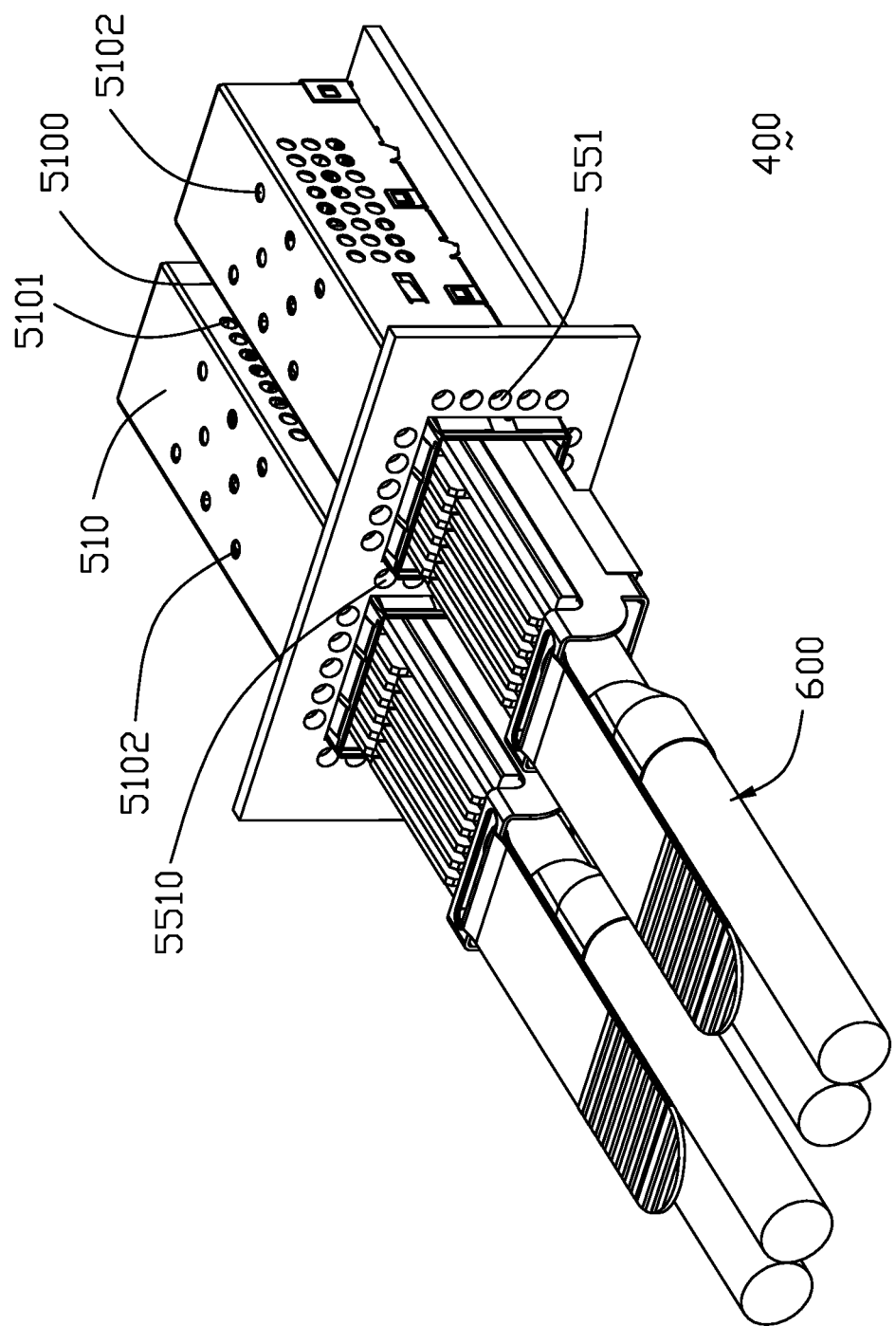
FIG. 15 is a perspective view of the electrical connector assembly according to a third embodiment of the invention wherein a pair of plug module unit are received within the respective cage to mate with the corresponding receptacle connector unit located around a rear end in the cage.
Figure 16:
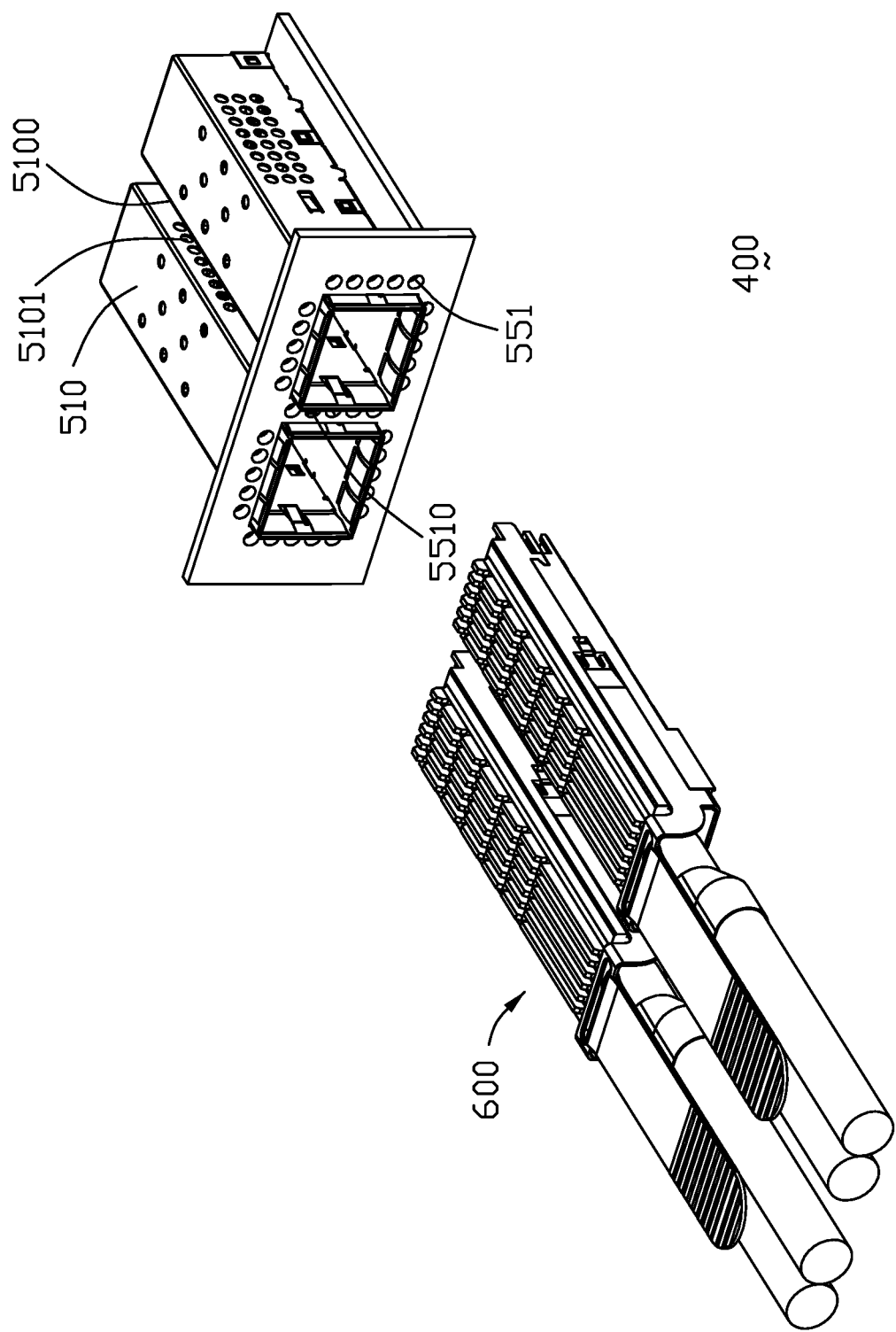
FIG. 16 is an exploded perspective view of the electrical connector assembly of FIG. 15 wherein the plug module units are removed from the corresponding cages.
Figure 17:
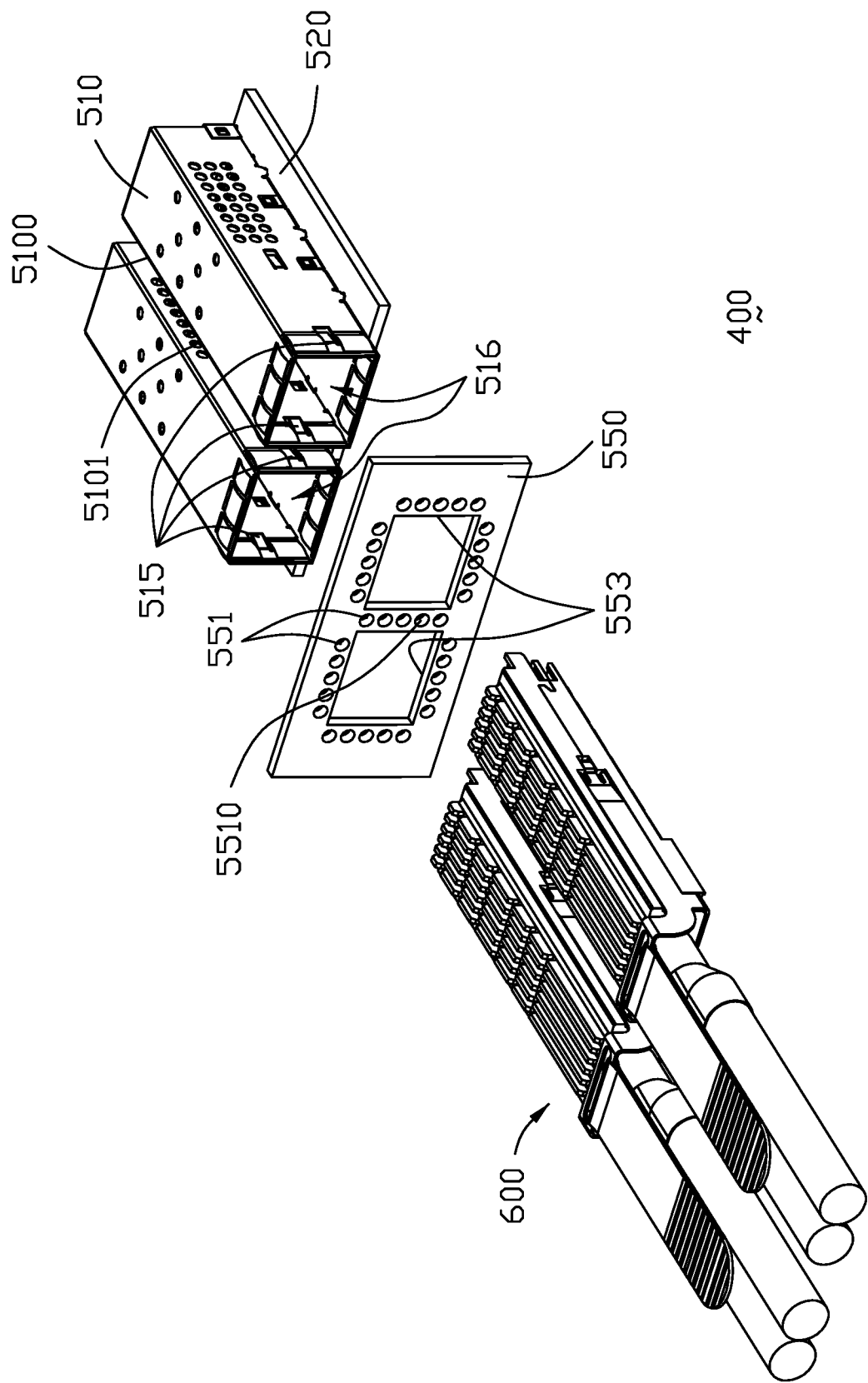
FIG. 17 is an further exploded perspective view of the electrical connector assembly of FIG. 16.
Figure 18:
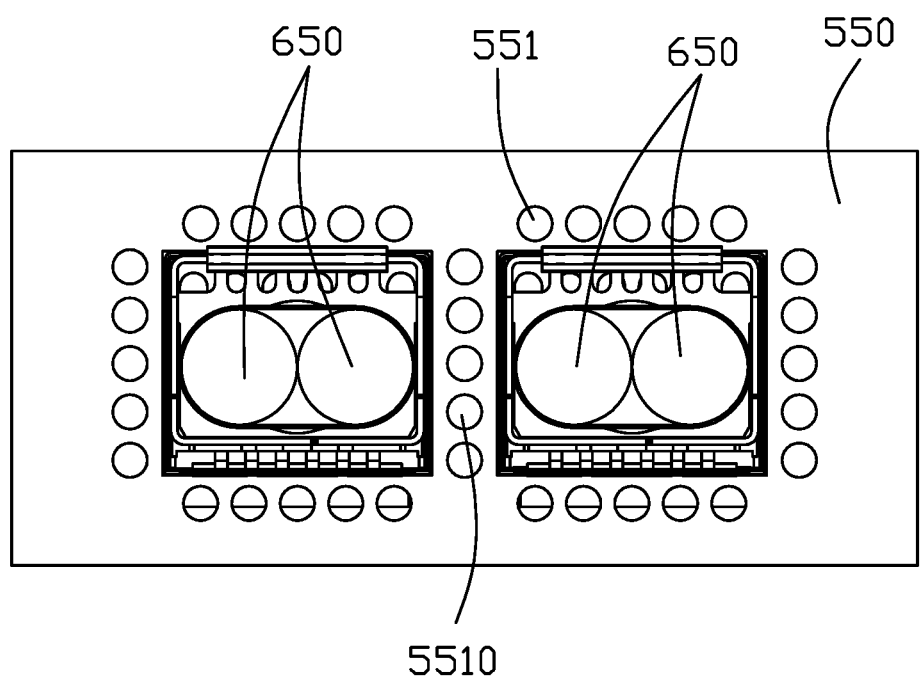
FIG. 18 is a front elevational view of the electrical connector assembly of FIG. 15.
Figure 19:
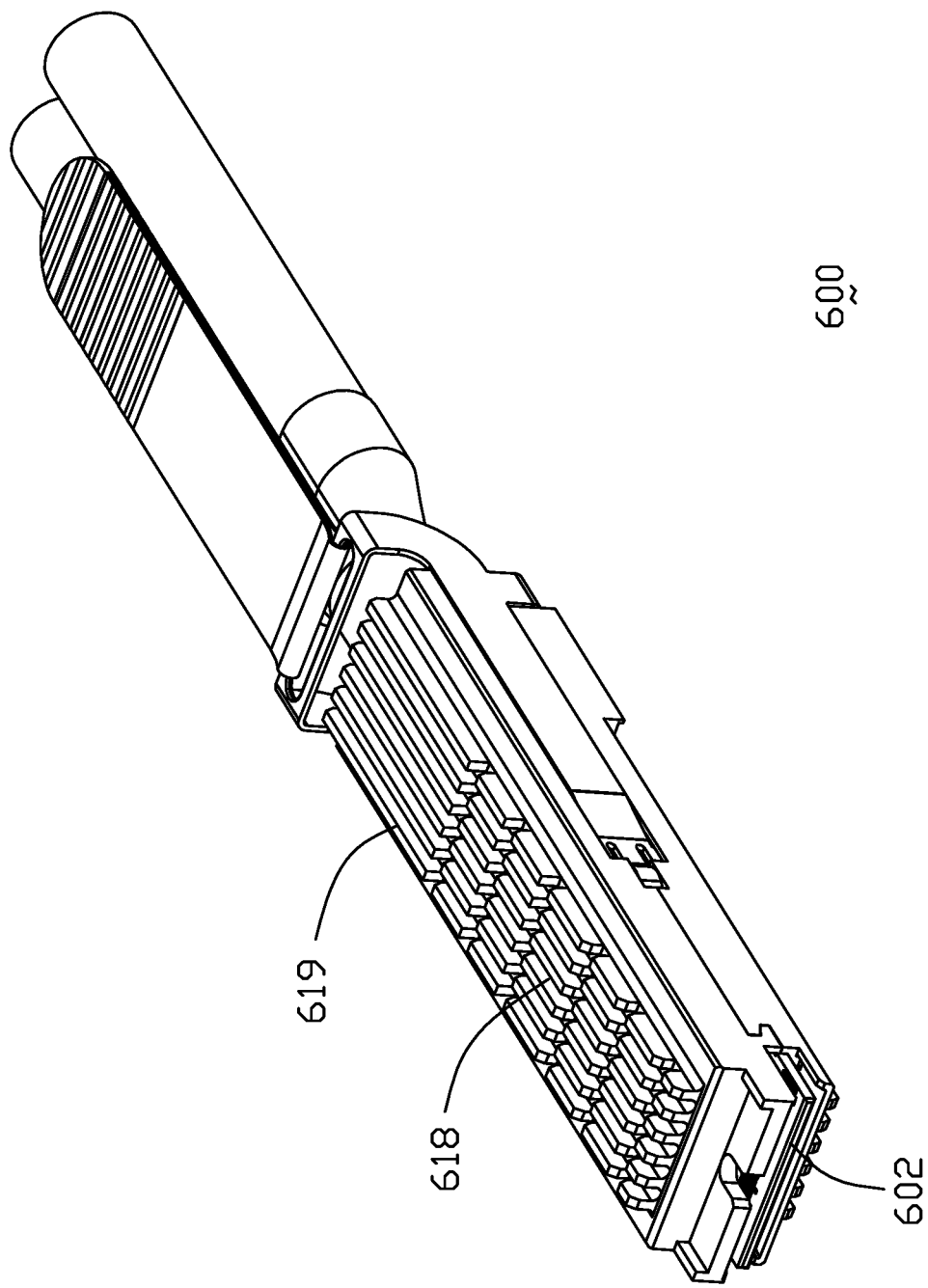
FIG. 19 is a perspective view of the plug module unit of the electrical connector assembly of FIG. 15.
Figure 20:
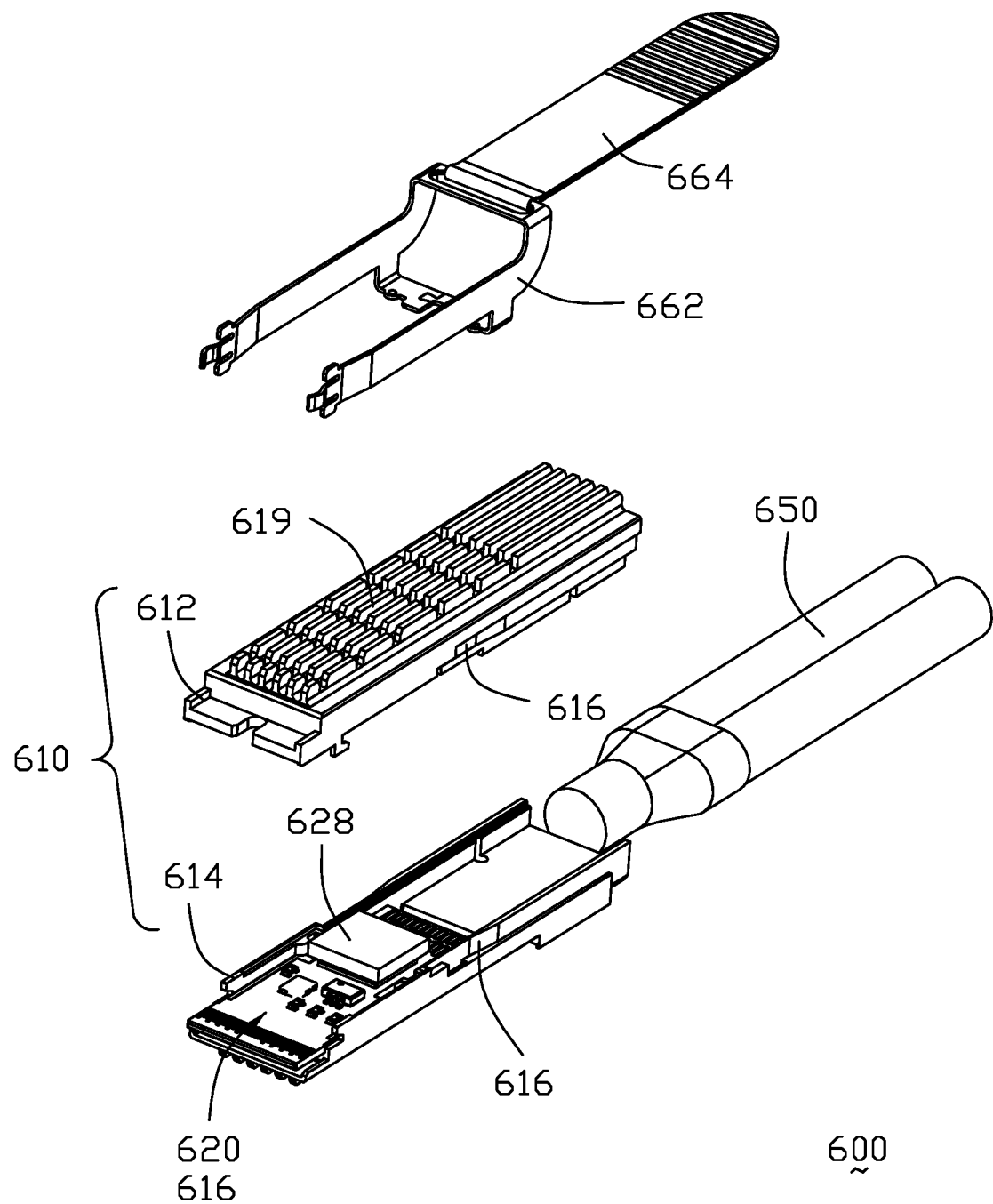
FIG. 20 is an exploded perspective view of the plug module unit of the electrical connector assembly of FIG. 19.
Figure 21A:
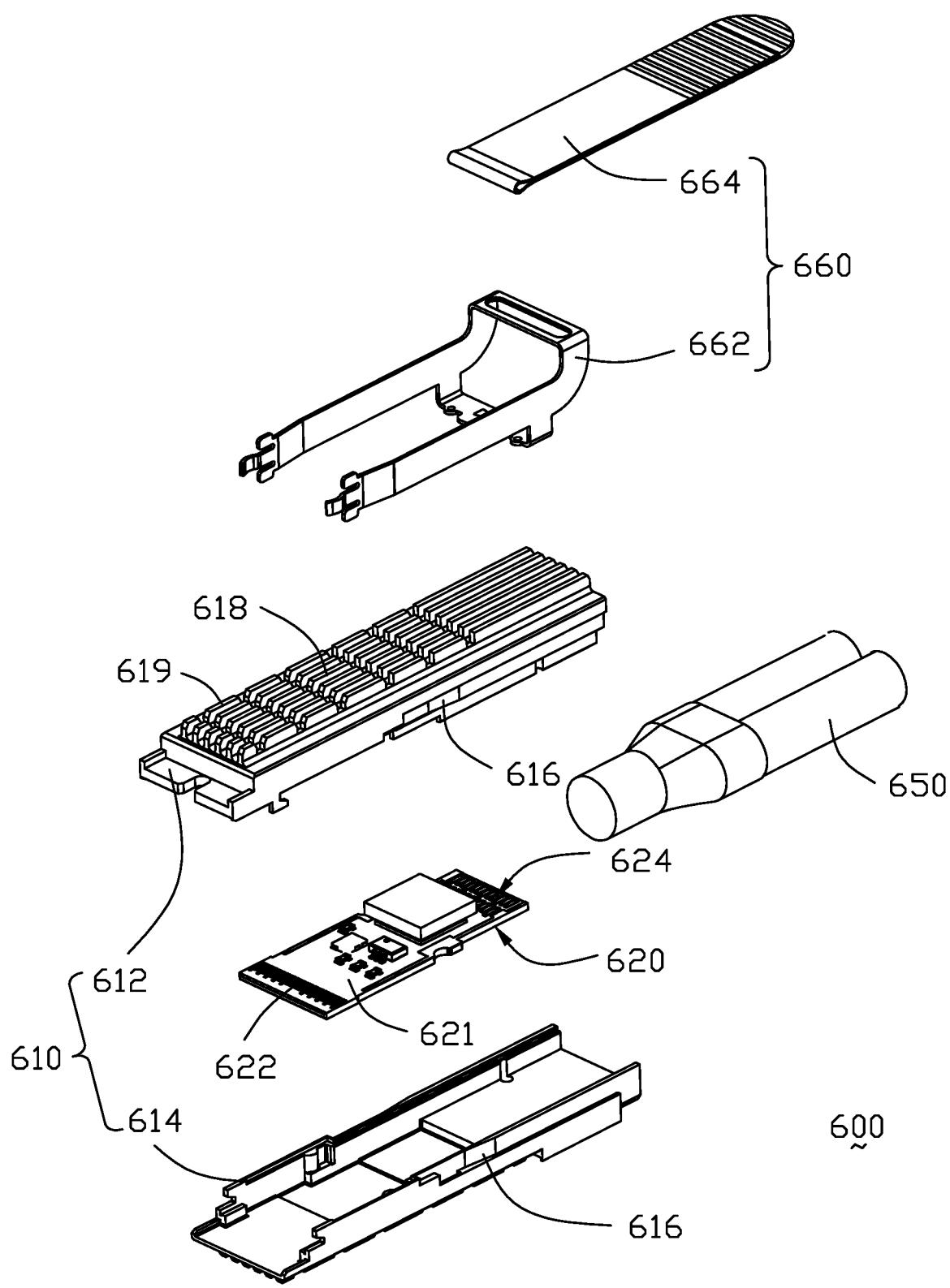
FIG. 21(A) is a further another perspective view of the plug module unit of the electrical connector assembly of FIG. 20.
Figure 21B:
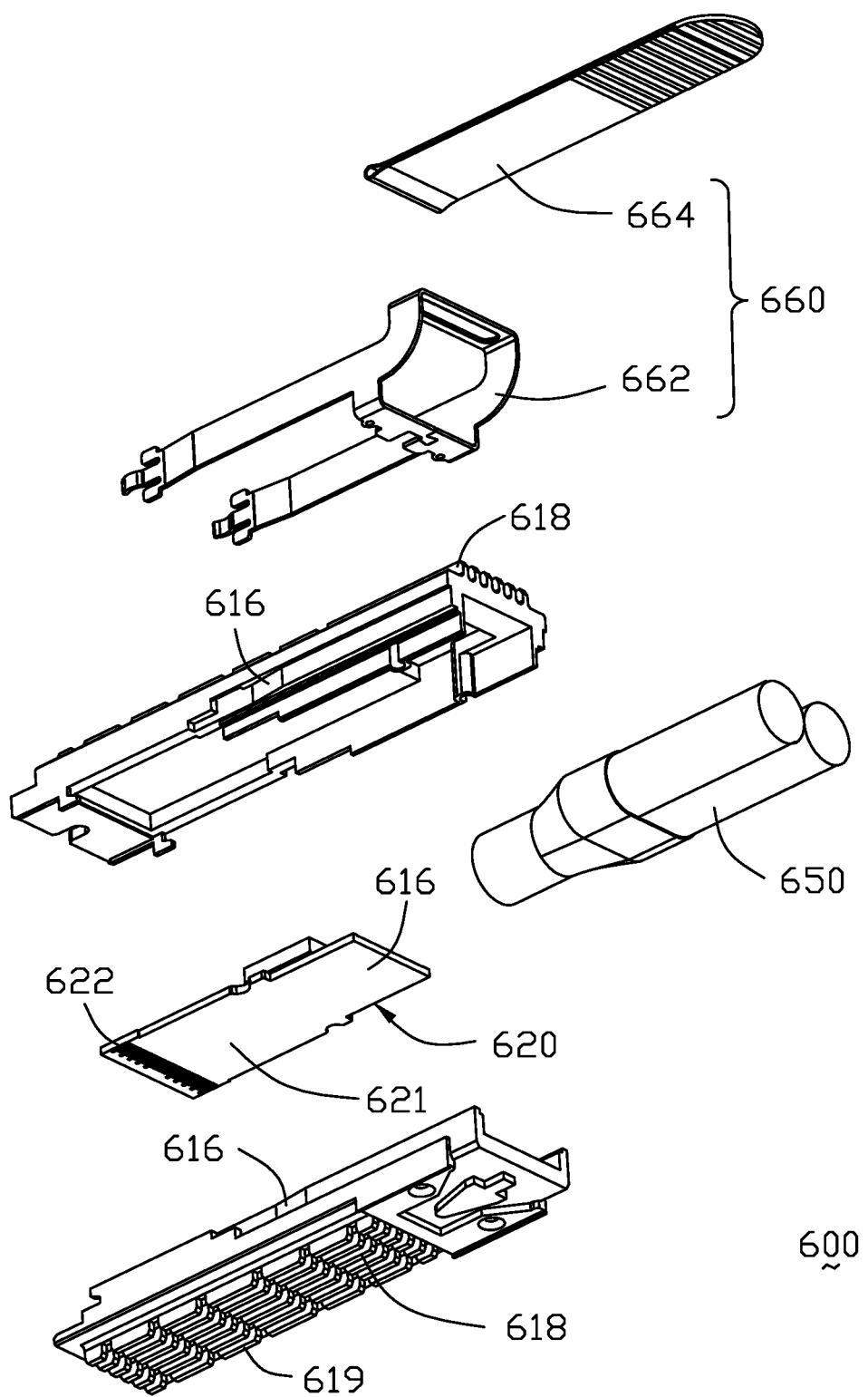
FIG. 21(B) is another further exploded perspective view of the plug module unit of the electrical connector assembly of FIG. 20.
Figure 22A:
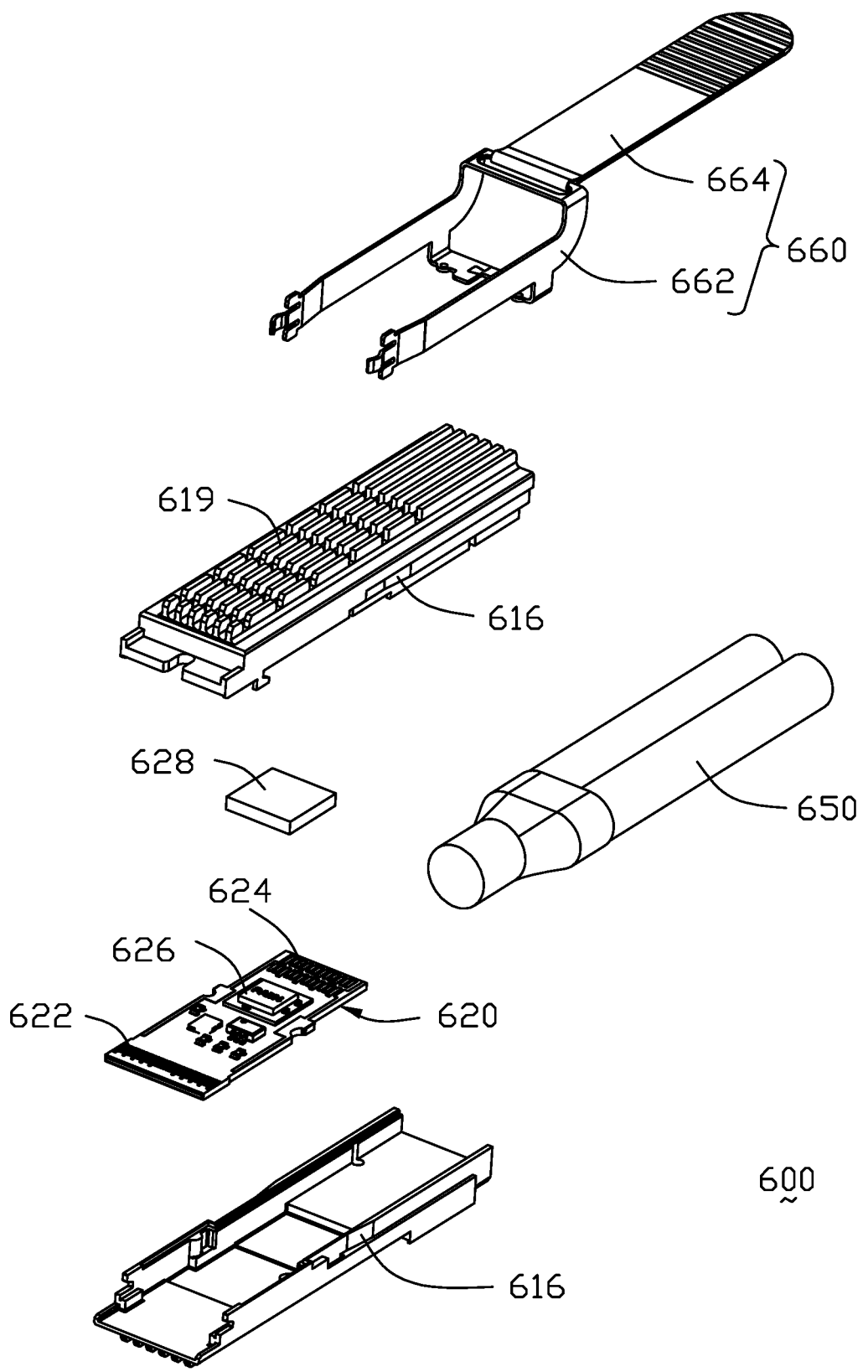
FIG. 22(A) is a further exploded perspective view of the plug module unit of the electrical connector assembly of FIG. 21(A)
Figure 22B:
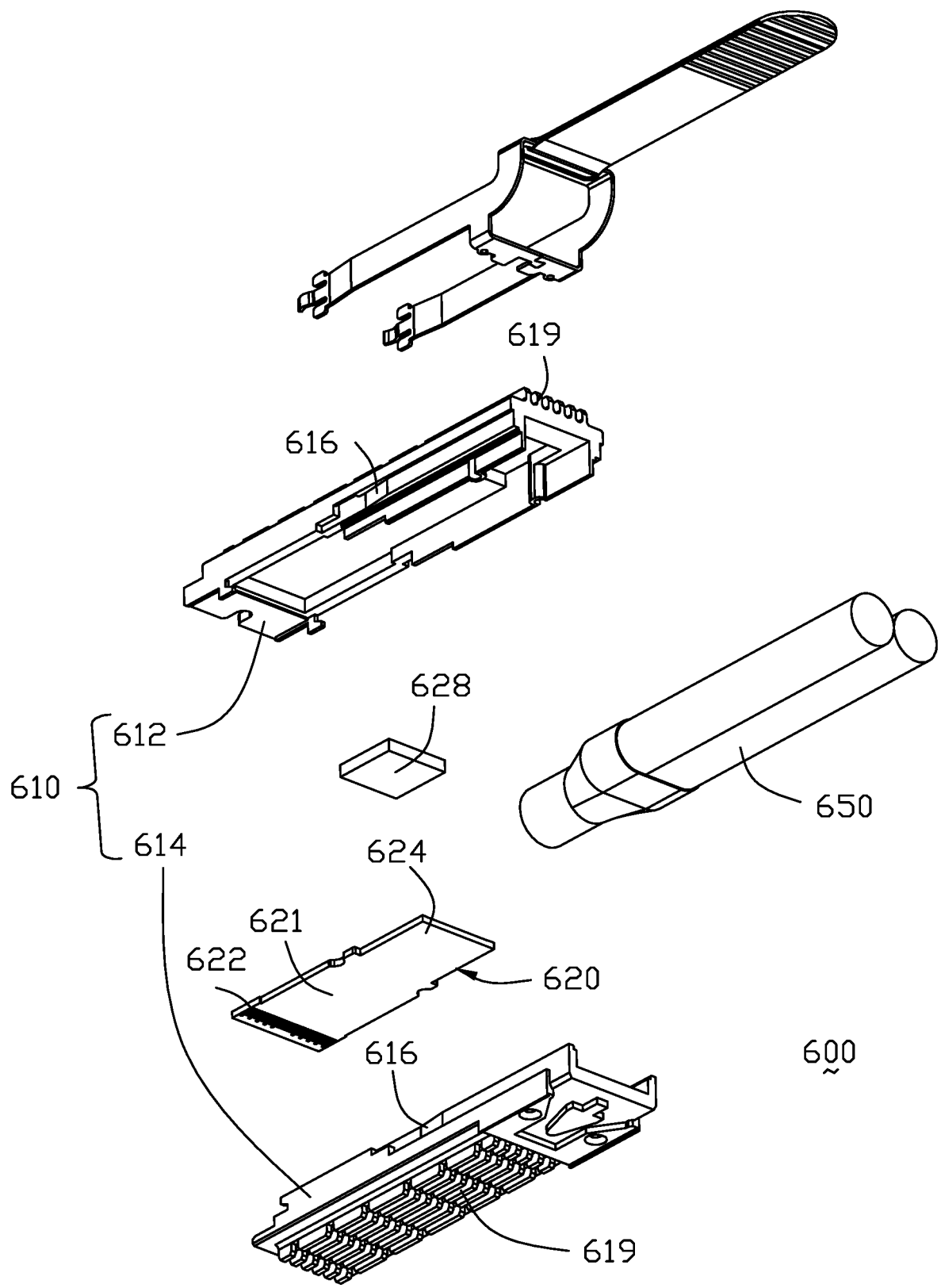
FIG. 22(B) is another further exploded perspective view of the plug module of the electrical connector assembly of FIG. 21(B)

Reference will now be made in detail to the preferred embodiment of the present invention. Referring to FIGS. 1-14(B), according to the first embodiment of the invention, an electrical connector assembly 10 includes a shielding shell or cage 100 composed of a main case 103 and a bottom plate 107 to commonly form a receiving space 102 therein, and a receptacle connector unit 200 received in a rear end region of the receiving space 102 for mating with a plug module unit which is adapted to be inserted into and received within the receiving space 102 in front of the receptacle connector unit 200. The receptacle connector unit 200 includes an insulative housing 202 forming two mating ports 204, and a plurality of terminal wafers 210 stacked with one another along the transverse direction. The housing 202 includes a main part 206 forming the two mating ports 204 thereon, and a spacer 208 attached to the main part 206. Each of the terminal wafers 210 includes a plurality of terminals 211 with the corresponding contacting sections 212 exposed upon the corresponding mating ports 204 and the corresponding tail sections 214 extending downwardly to be soldered upon the printed circuit board 300 on which the electrical connector assembly 10 is mounted. Notably, in this embodiment, the spacer 208 forms a plurality of slots 209 through which the tail sections 214 downwardly extend. During assembling, the wafers 210 are first downwardly assembled upon the spacer 208 and successively commonly forwardly assembled into the main part 206 from a rear side of the main part 206 wherein the securing tabs 205 are engaged within the corresponding recesses 207 in the main part 206 so as to secure the spacer 208 to the main part 206. Understandably, the wafers 210 are retained by cooperation of the main part 206 and the spacer 208 in both the front-to-back direction and the vertical direction while by respective main part 206 and the spacer 208 in the transverse direction.

A middle heat transfer unit 220 is located between the pair of mating ports 204, and includes a thermal plastic pad 222, and a pair of heat pipes 224 insert-molded in the corresponding grooves 223 therein. Notably, the thermal plastic pad 222 is an alternate one with regard to the metallic one as disclosed in the aforementioned previously filed provisional application 62/509,141. The heat pipes 224 extend rearward out of the rear wall of the cage 100 to be connected to a rear heat sink unit 230 which includes a plurality of fins 232 spaced form one another along the transverse direction (FIG. 4) while unitarily formed with a common base 234 through which the heat pipes 224 extends rearwardly. In this embodiment, the heat pipe 224 includes an oblique section 226 embedded in the thermal plastic pad 222. A U-shaped metallic structure 250 retainably encloses the thermal plastic pad 222 by means of the retaining tabs 257, and includes securing tabs 251 assembled upon the cage 100 for retaining the middle heat transfer unit 220 in position in the cage 100. The metallic structure 250 further forms an opening 252 downwardly communicating with the receiving space 102 for allowing the terminal plastic pad 222 to contact the inserted lower plug module unit (not shown). A top heat sink 240 is attached upon the top wall of the cage 100 via a retainer clip 242. The cage 100 forms an opening 105 to allow the top heat sink 240 to contact the inserted upper plug module unit (not shown). A gasket 108 is attached upon a front end of the cage 100 and a pair of gaskets 253 are attached upon a front end of the U-shaped metallic structure 250 for compliantly abutting against the panel through which the cage 100 extends and the inserted plug module units (not shown), respectively. It is noted that in this embodiment the bottom plate 107 forms a plurality of through holes 109 through which the mounting legs 108 of the main case 103 extend downwardly for mounting to the printed circuit board 300.

Referring to FIGS. 15-26, an electrical or receptacle connector assembly 400 includes a receptacle connector unit 500 comprising a pair of receptacle connector 501 enclosed within or received in a pair of metallic cages 510 respectively and mounted upon a printed circuit board 520. The cages 510 extending through a panel 550 which is disposed at front of the printed circuit board 520, each includes a main case 512 and a bottom plate 514 assembled together to commonly define a receiving space 516 in which the receptacle connector 501 is located at a rear region of the receiving space 516. A metallic gasket 518 is attached upon a front end of the cage 510 to radially contact the panel 550. In this embodiment, the panel 550 forms two openings 553 through which the corresponding cages 510 forwardly extend wherein a plurality of through holes 551 extend through the panel 550 surrounding the corresponding openings 553 and the cages 510. It is also noted that the cage 510 includes a pair of resilient locking tabs 515 which could be releasably engaged with the plug module unit 600 received in the receiving space 516.

The pair of cages 510 are arranged side by side with a gap 5100. Each of the cages 510 defining at least one side through hole 5101 in communication with the gap 511 and the receiving space 516. Each of the cages 510 further comprises a plurality of through holes 5102 in top and rear side and arranged in at least one row or column. In this embodiment, there are a plurality of side through holes 5101 arranged in a plurality of rows and columns. The through holes 551 defined on the panel 550 comprises at least one middle through hole 5510 in communication with the gap 511 for air flowing. In this embodiment, there are a plurality of middle through holes 5510 arranges in a column. The receptacle connector 501 is lower than a top side of the cage 510 that allows the airflow flowed to a rear side of the cage 510. Therefore, the through holes 5102 defined in the rear of the cages are in communication with the receiving space 516 when the receptacle connector 501 is received in the receiving space 516.

A pair of plug module units or plug modules 600 are adapted to be received in the receiving space 516 of the two cages 510 and mated with the receptacle connectors 501, respectively. Each plug module unit 600 includes a die-casting case 610 composed of an upper part 612 and a lower part 614 assembled to each other to commonly form a receiving space 616 to receive a printed circuit board assembly 620 therein.

Both of the upper part 612 and the lower part 614 have their own heat sinks or heat sink structures 618 located on the corresponding exterior surfaces. In this embodiment, the heat sink structures 618 are unitarily formed thereon. The heat sink structures 618 formed allow airflow in communication with all of the through holes 5101 and the additional through holes 5102. The heat sink 618 includes a plurality of fins 619 extending along a front-to-back direction. The fins 619 are arranged to allow airflow in first direction and a second direction crossed with the first direction. In this embodiment, the heat sink structures 618 are utilized riding heat-sinks. The first direction is perpendicular to the second direction. The fins 619 extend along the first direction, and spaced apart from each in the first direction and the second direction. The fins 619 have different size. The fins 619 are almost fully occupy exterior surfaces of the upper part 612 and the lower part 614.

A latch releasing mechanism 660 includes a metallic actuator 662 and a pulling tape 664 attached thereto. The actuator 662 may release the locking tabs 515 from the plug module unit 600 via rearward moving of the pulling tape 664. The upper part 612 and the lower part 614 commonly form a receiving groove 616 in which the actuator 662 is received and along which the actuator 662 moves along the front-to-back direction. In this embodiment, each of the upper part 612 and the lower part 614 has a height of at least one half of the case 610 in the vertical direction wherein the printed circuit board 621 itself is essentially received in the lower part 614. An area of the heat sink structure 618 located on the surface of the upper part 612 is greater than an area of the heat sink structure 618 located on the surface of the lower part 614, as the latch releasing mechanism 660 occupies some area of the lower part 614.

The printed circuit board assembly 620 includes a printed circuit board 621 with a front mating portion 622 exposed in a front mating port 602 of the plug module unit 600, a connecting portion or rear portion 624 for connecting to a cable such as a copper cable, optical cable, optical waveguide etc., and a heat-generating component 626 such as an electrical IC, optical-electrical module etc therebetween in a front-to-back direction. In this embodiment, the connecting portion 624 is mechanically and electrically connected to a pair of cables 650.

Figure 23:
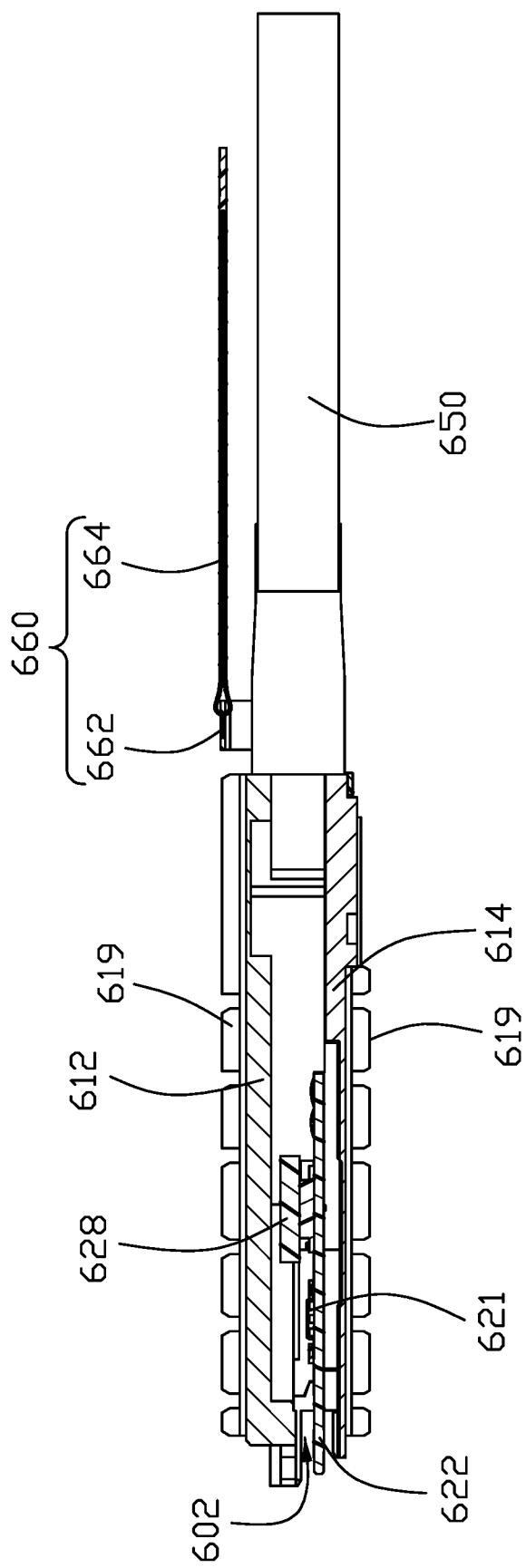
FIG. 23 is a cross-sectional view of the plug module unit of the electrical connector assembly of FIG. 15.
Figure 24:
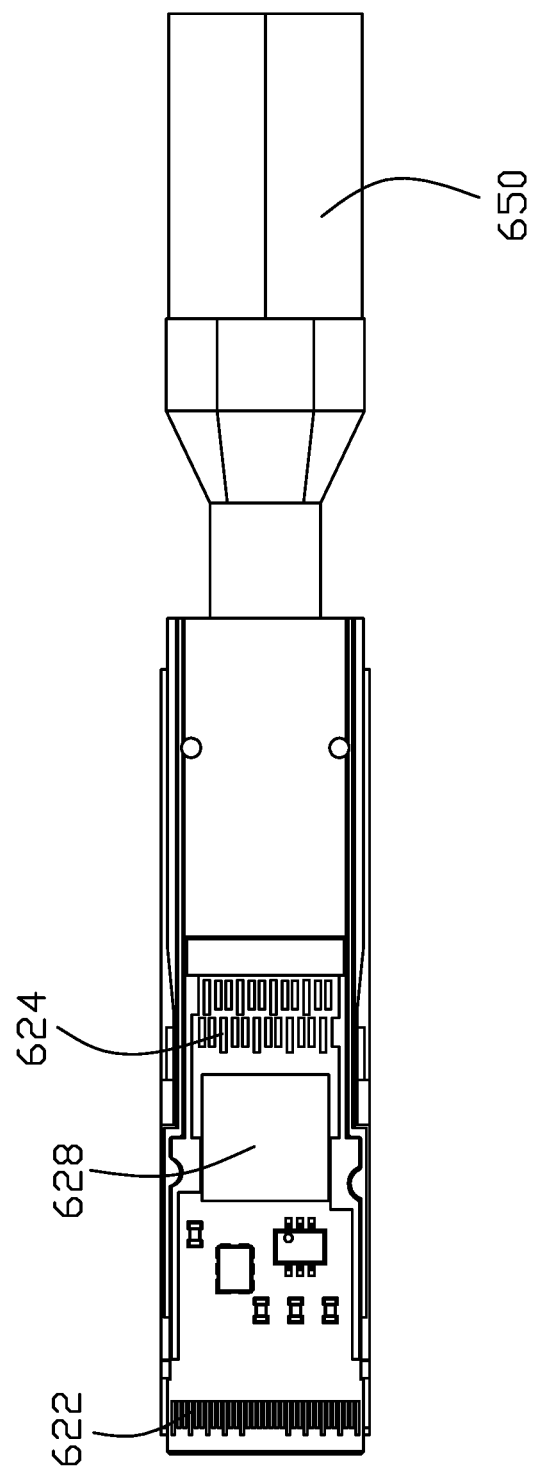
FIG. 24 is another cross-sectional view of the plug module unit of the electrical connector assembly of FIG. 15.
Figure 25:
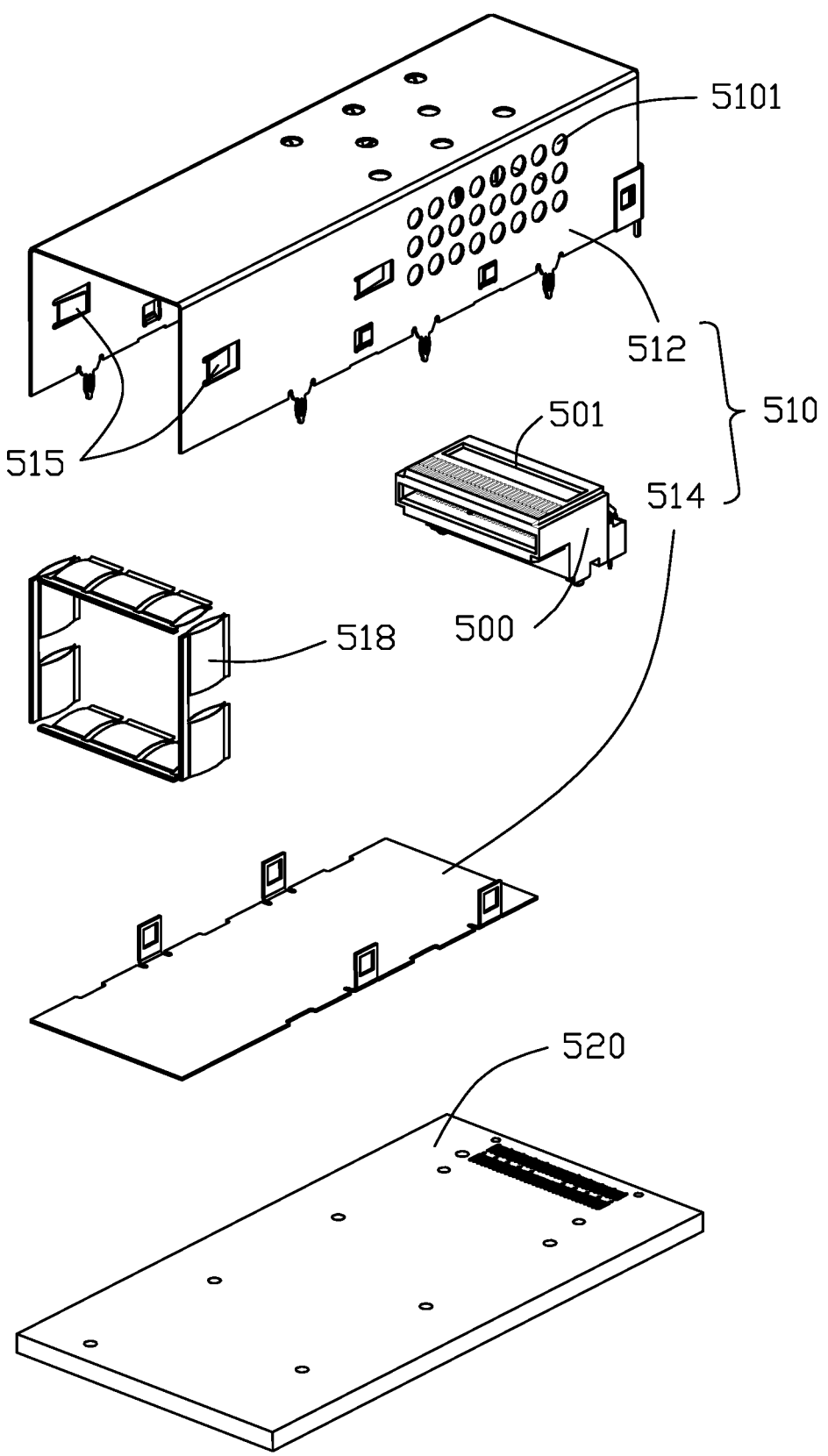
FIG. 25 is an exploded perspective view of the receptacle connector unit of the electrical connector assembly of FIG. 15.
Figure 26A:
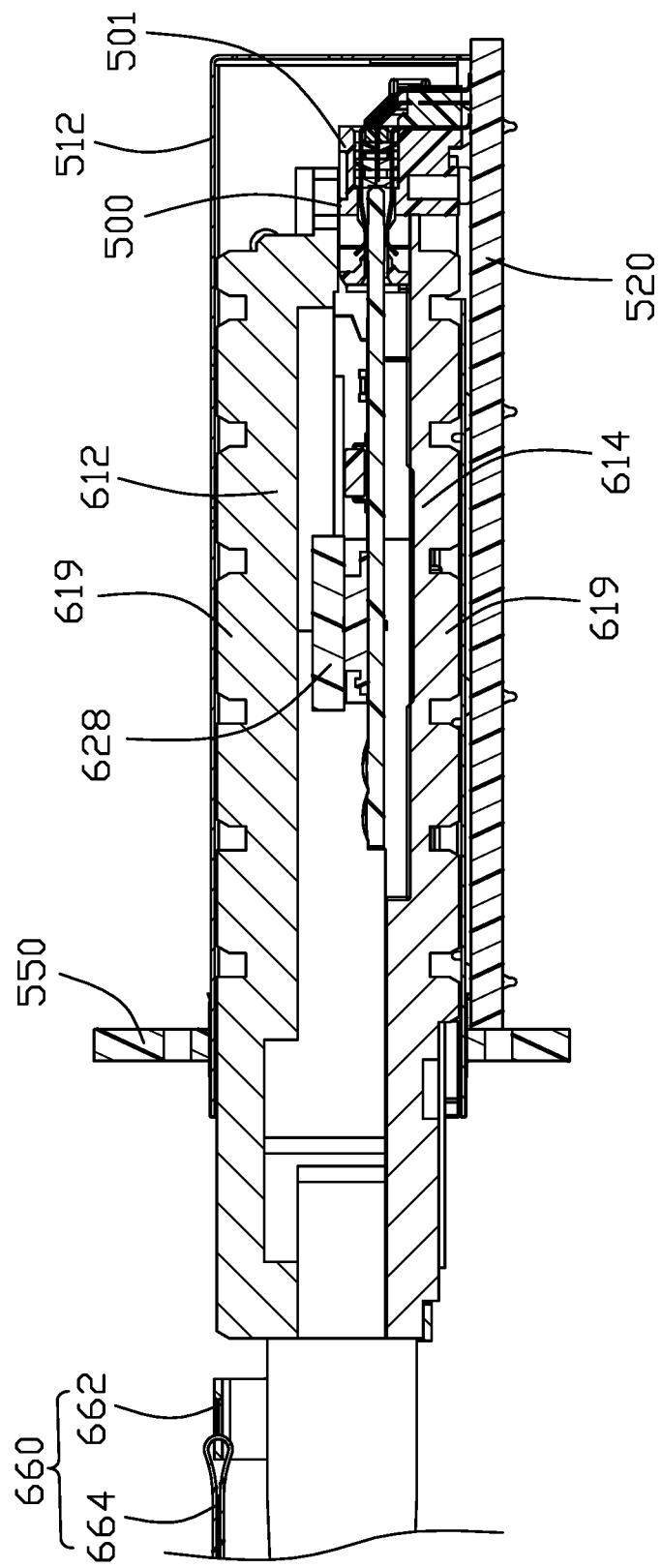
FIG. 26(A) is a cross-sectional view of the electrical connector assembly of FIG. 15.
Figure 26B:
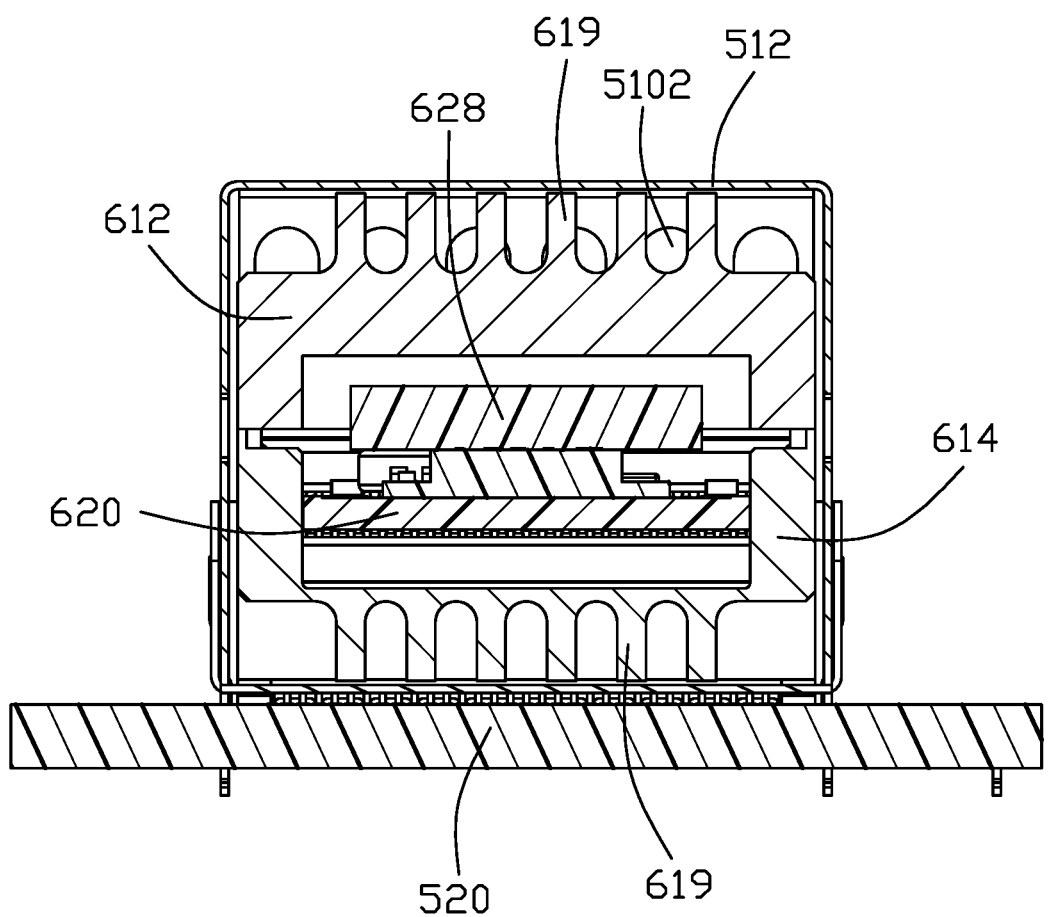
FIG. 26 (B) is another cross-sectional view of the electrical connector assembly of FIG. 15.

Notably, as shown in FIGS. 23, 26(A) and 26(B), in operation the plug module unit 600 is inserted into the receiving space 516 to mate with the corresponding receptacle connector unit 500 wherein the thermal pad 628 may be, directly by adjusting the height thereof or indirectly via additional deformable thermal pad (not shown) disposed upon the thermal pad 628, sandwiched between the component 626 and the upper part 612 or the lower part 614 in the vertical direction for efficiently removing the heat generated by the component 626 to the heat sink structures 618.

In this embodiment, the fins 619 of the upper part 612 upwardly contacts the main case 512 and the fins 619 of the lower part 614 contacts the bottom plate 514. Notably, the upper part 612 and the lower part 614 abut against each other not only in the vertical direction but also in the transverse direction perpendicular to the vertical direction so as to increase the interface areas therebetween for enhancement of the heat transfer thereof.

What is claimed is:

1. A receptacle connector assembly comprising:
a printed circuit board;
a panel disposed at front of the printed circuit board;
a pair of cages mounted on the printed circuit board and extending through the panel, the pair of cages arranged side by side with a gap therebetween, each of the cages defining a receiving space for receiving a plug module, each of the cages defining at least one side through hole in communication with the gap and the receiving space; and
a pair of receptacle connectors mounted on the printed circuit board and received in the cages, respectively;
wherein the panel defines at least one middle through hole in communication with the gap for air flowing.

2. The receptacle connector assembly as claimed in claim 1, wherein there are a plurality of middle through holes arranges in a column.

3. The receptacle connector assembly as claimed in claim 1, wherein there are a plurality of side through holes arranged in a plurality of rows and columns.

4. The receptacle connector assembly as claimed in claim 1, wherein the panel further defines a plurality of additional through holes located surrounding outer sides of the cages, the plug module comprising a pair of heat sink structures located on exterior surfaces of top side and the bottom side respectively, the heat sink structures formed to allow airflow in communication with all of the through holes and the additional through holes.

5. The receptacle connector assembly as claimed in claim 1, wherein the receptacle connector is lower than a top side of the cage to allow airflow to a rear side of the cage.

* * * * *